(12) United States Patent
Noori et al.

(10) Patent No.: US 11,863,130 B2
(45) Date of Patent: Jan. 2, 2024

(54) GROUP III NITRIDE-BASED RADIO FREQUENCY TRANSISTOR AMPLIFIERS HAVING SOURCE, GATE AND/OR DRAIN CONDUCTIVE VIAS

(71) Applicant: Wolfspeed, Inc., Durham, NC (US)

(72) Inventors: Basim Noori, San Jose, CA (US); Marvin Marbell, Morgan Hill, CA (US); Qianli Mu, San Jose, CA (US); Kwangmo Chris Lim, San Jose, CA (US); Michael E. Watts, Scottsdale, AZ (US); Mario Bokatius, Chandler, AZ (US); Jangheon Kim, Chandler, AZ (US)

(73) Assignee: Wolfspeed, Inc., Durham, NC (US)

( * ) Notice: Subject to any disclaimer, the term of this patent is extended or adjusted under 35 U.S.C. 154(b) by 504 days.

(21) Appl. No.: 17/215,456

(22) Filed: Mar. 29, 2021

(65) Prior Publication Data

US 2021/0313935 A1 Oct. 7, 2021

Related U.S. Application Data

(60) Provisional application No. 63/004,985, filed on Apr. 3, 2020.

(51) Int. Cl.
*H03F 3/187* (2006.01)
*H03F 1/56* (2006.01)
(Continued)

(52) U.S. Cl.
CPC ........... *H03F 1/565* (2013.01); *H01L 23/481* (2013.01); *H01L 23/49822* (2013.01);
(Continued)

(58) Field of Classification Search
CPC ................. H03F 3/187; H03F 3/191
(Continued)

(56) References Cited

U.S. PATENT DOCUMENTS 3,969,745 A 7/1976 Blocker
6,586,833 B2 7/2003 Baliga
(Continued)

FOREIGN PATENT DOCUMENTS

EP 1693891 B1 7/2019
EP 3783663 A1 2/2021
(Continued)

OTHER PUBLICATIONS

Notification of Transmittal of the International Search Report and the Written Opinion of the International Searching Authority, or the Declaration, in corresponding PCT Application No. PCT/US2021/021848 (dated Jun. 18, 2021).

(Continued)

*Primary Examiner* — Henry Choe
(74) *Attorney, Agent, or Firm* — Myers Bigel, P.A.

(57) ABSTRACT

RF transistor amplifiers include a Group III nitride-based RF transistor amplifier die that includes a semiconductor layer structure, a conductive source via that is connected to a source region of the Group III nitride-based RF transistor amplifier die, the conductive source via extending through the semiconductor layer structure, and an additional conductive via that extends through the semiconductor layer structure. A first end of the additional conductive via is connected to a first external circuit and a second end of the additional conductive via that is opposite the first end is connected to a first matching circuit.

24 Claims, 25 Drawing Sheets

(51) Int. Cl.
*H01L 23/48* (2006.01)
*H01L 23/498* (2006.01)
*H01L 23/00* (2006.01)
*H01L 29/778* (2006.01)
*H03F 3/193* (2006.01)

(52) U.S. Cl.
CPC ............ *H01L 24/08* (2013.01); *H01L 29/778* (2013.01); *H03F 3/193* (2013.01); *H01L 2224/08225* (2013.01); *H03F 2200/222* (2013.01); *H03F 2200/387* (2013.01); *H03F 2200/451* (2013.01)

(58) Field of Classification Search
USPC ................................................. 330/307, 302
See application file for complete search history.

(56) References Cited

U.S. PATENT DOCUMENTS

| | | | |
|---|---|---|---|
| 9,786,660 | B1 | 10/2017 | Farrell et al. |
| 9,807,882 | B1 | 10/2017 | Berdy et al. |
| 10,438,894 | B1 | 10/2019 | Farooq et al. |
| 10,855,244 | B2* | 12/2020 | Trang .................. H01L 23/5227 |
| 11,114,988 | B2* | 9/2021 | Kim ........................ H03F 3/245 |
| 11,521,957 | B1 | 12/2022 | Lee |
| 11,557,539 | B1 | 1/2023 | Romanczyk et al. |
| 11,587,852 | B2 | 2/2023 | Shilimkar et al. |
| 11,652,461 | B2* | 5/2023 | Trang ..................... H03F 3/193 327/551 |
| 11,735,538 | B2* | 8/2023 | Radulescu .......... H01L 29/2003 257/194 |
| 2002/0179945 | A1 | 12/2002 | Sakamoto et al. |
| 2004/0238857 | A1 | 12/2004 | Beroz et al. |
| 2008/0099800 | A1 | 5/2008 | Miller et al. |
| 2009/0020848 | A1 | 1/2009 | Ono et al. |
| 2009/0091011 | A1 | 4/2009 | Das et al. |
| 2010/0109052 | A1 | 5/2010 | Nakajima et al. |
| 2011/0215472 | A1 | 9/2011 | Chandrasekaran |
| 2011/0304013 | A1 | 12/2011 | Chen et al. |
| 2011/0309372 | A1 | 12/2011 | Xin et al. |
| 2012/0018892 | A1 | 1/2012 | Soltan |
| 2012/0086497 | A1 | 4/2012 | Vorhaus |
| 2012/0299178 | A1 | 11/2012 | Kanaya et al. |
| 2013/0168854 | A1 | 7/2013 | Karikalan et al. |
| 2014/0014969 | A1 | 1/2014 | Kunii et al. |
| 2014/0054604 | A1 | 2/2014 | Ritenour |
| 2014/0159118 | A1 | 6/2014 | Lenci et al. |
| 2014/0312458 | A1 | 10/2014 | Ashrafzadeh et al. |
| 2015/0171015 | A1 | 6/2015 | Mahajan et al. |
| 2015/0171080 | A1 | 6/2015 | Vorhaus |
| 2016/0285418 | A1 | 9/2016 | Jones et al. |
| 2017/0025349 | A1 | 1/2017 | Wood |
| 2017/0053909 | A1 | 2/2017 | Laighton et al. |
| 2017/0062319 | A1 | 3/2017 | Guo et al. |
| 2017/0110451 | A1 | 4/2017 | Fraser et al. |
| 2017/0294528 | A1 | 10/2017 | Ren et al. |
| 2018/0138132 | A1 | 5/2018 | Nishizawa et al. |
| 2019/0097001 | A1 | 3/2019 | Laroche et al. |
| 2019/0131273 | A1 | 5/2019 | Chen et al. |
| 2019/0148276 | A1 | 5/2019 | Chen et al. |
| 2019/0199289 | A1 | 6/2019 | Wei et al. |
| 2019/0304913 | A1 | 10/2019 | Wu et al. |
| 2019/0356274 | A1 | 11/2019 | Zhu et al. |
| 2020/0043946 | A1 | 2/2020 | Paul et al. |
| 2020/0105741 | A1 | 4/2020 | Lin et al. |
| 2020/0118922 | A1 | 4/2020 | Hill |
| 2020/0135766 | A1 | 4/2020 | Dutta et al. |
| 2020/0168602 | A1 | 5/2020 | Kojima et al. |
| 2020/0287536 | A1 | 9/2020 | Udrea et al. |
| 2020/0373892 | A1* | 11/2020 | Kim ....................... H03F 3/2171 |
| 2021/0098408 | A1 | 4/2021 | Ting et al. |
| 2021/0151428 | A1 | 5/2021 | Dutta et al. |
| 2021/0167199 | A1* | 6/2021 | Sriram ................ H01L 29/7783 |
| 2021/0202408 | A1 | 7/2021 | Khalil et al. |
| 2021/0257472 | A1 | 8/2021 | Sato et al. |
| 2021/0398971 | A1 | 12/2021 | Som et al. |
| 2022/0020874 | A1 | 1/2022 | Fisher et al. |
| 2022/0044986 | A1 | 2/2022 | Khalil et al. |
| 2022/0190126 | A1 | 6/2022 | Kabir et al. |

FOREIGN PATENT DOCUMENTS

| | | |
|---|---|---|
| TW | 201810673 A | 3/2018 |
| TW | 201813016 A | 4/2018 |
| TW | 202013658 A | 4/2020 |
| WO | 2019132941 A1 | 7/2019 |

OTHER PUBLICATIONS

"Notification of Transmittal of the International Search Report and the Written Opinion of the International Searching Authority, or the Declaration for corresponding International Application No. PCT/US2021/021845, dated date: Jul. 5, 2021, (14 pages)".

"Notification of Transmittal of the International Search Report and the Written Opinion of the International Searching Authority, or the Declaration for corresponding International Application No. PCT/US2022/023916, dated Jun. 30, 2021, (13 pages)".

"Qin Zheng et al: "Electrical simulation of thin film inductors on silicon and glass substrates", 2014 Joint IEEE International Symposium, IEEE, May 12, 2014, pp. 555-559".

"Taiwan Office Action in Corresponding Patent Application No. 110112239, dated Mar. 9, 2023, 6 pages".

Notification of Transmittal of the International Search Report and the Written Opinion of the International Searching Authority, or the Declaration, in corresponding PCT Application No. PCT/US2021/024623 (dated Jul. 16, 2021).

"Indian Examination Report in Corresponding Patent Application No. 202247061172, dated Jan. 2, 2023, 4 pages".

"Indian Examination Report in Corresponding Patent Application No. 202247061192, dated Dec. 28, 2022, 5 pages".

* cited by examiner

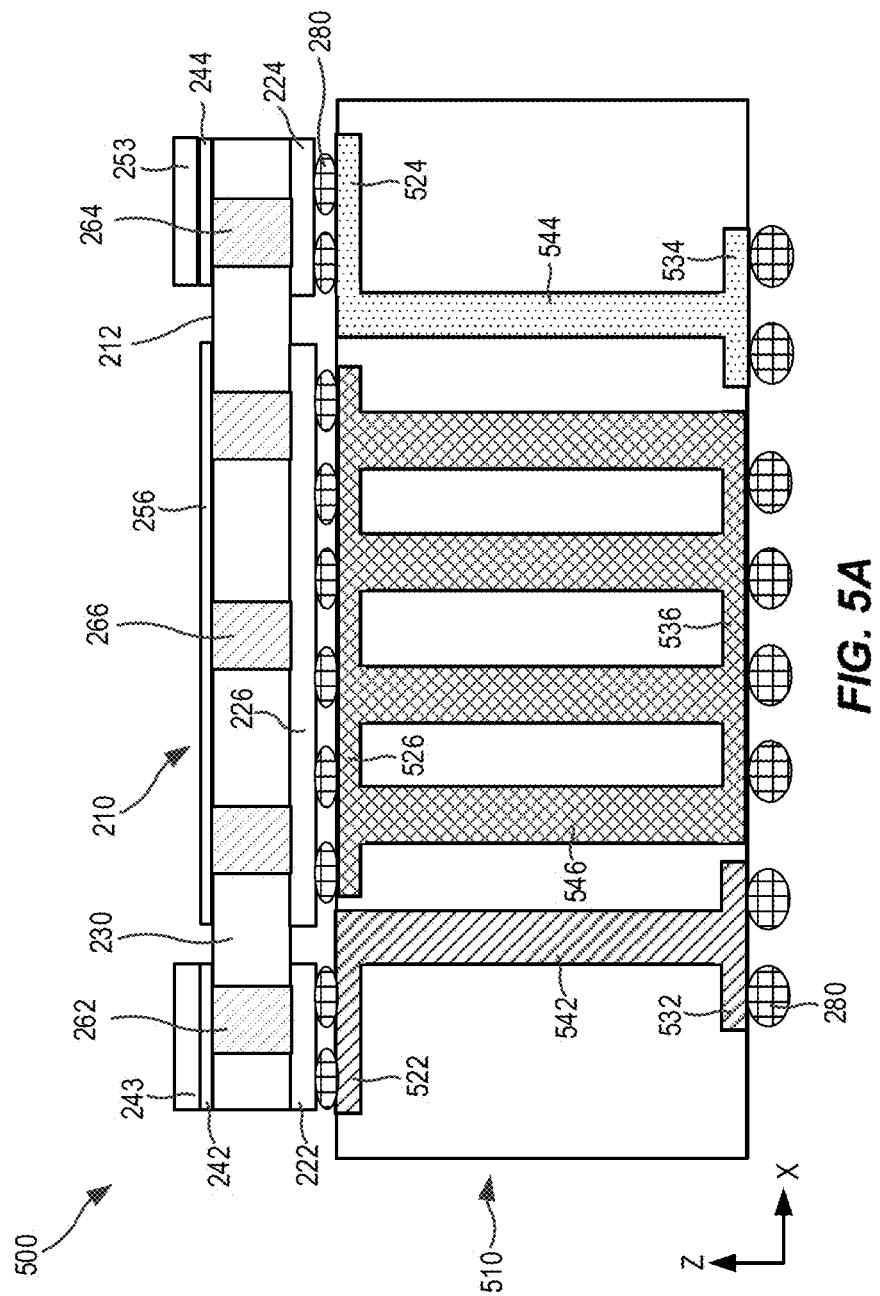

GROUP III NITRIDE-BASED RADIO FREQUENCY TRANSISTOR AMPLIFIERS HAVING SOURCE, GATE AND/OR DRAIN CONDUCTIVE VIAS

CROSS-REFERENCE TO RELATED APPLICATION

The present application claims priority under 35 U.S.C. § 119 to U.S. Provisional Patent Application Ser. No. 63/004,985, filed Apr. 3, 2020, the entire content of which is incorporated herein by reference.

FIELD

The present invention relates to microelectronic devices and, more particularly, to high power, high frequency transistor amplifiers.

BACKGROUND

Electrical circuits requiring high power handling capability while operating at high frequencies, such as R-band (0.5-1 GHz), S-band (3 GHz) and X-band (10 GHz), have in recent years become more prevalent. In particular, there is now a high demand for radio frequency ("RF") transistor amplifiers that are used to amplify RF signals at radio (including microwave) frequencies. These RF transistor amplifiers may need to exhibit high reliability, good linearity and handle high output power levels.

Most RF transistor amplifiers are implemented in silicon or using wide bandgap semiconductor materials, such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based RF transistor amplifiers are typically implemented using laterally diffused metal oxide semiconductor ("LDMOS") transistors. Silicon LDMOS RF transistor amplifiers can exhibit high levels of linearity and may be relatively inexpensive to fabricate. Group III nitride-based RF transistor amplifiers are typically implemented using High Electron Mobility Transistors ("HEMT") and are primarily used in applications requiring high power and/or high frequency operation where LDMOS RF transistor amplifiers may have inherent performance limitations.

RF transistor amplifiers may include one or more amplification stages, with each stage typically implemented as a transistor amplifier. In order to increase the output power and current handling capabilities, RF transistor amplifiers are typically implemented in a "unit cell" configuration in which a large number of individual "unit cell" transistors are arranged electrically in parallel. An RF transistor amplifier may be implemented as a single integrated circuit chip or "die," or may include a plurality of dies. When multiple RF transistor amplifier die are used, they may be connected in series and/or in parallel.

RF transistor amplifiers often include matching circuits, such as impedance matching circuits, that are designed to improve the impedance match between an RF amplifier die and transmission lines connected thereto for RF signals at the fundamental operating frequency and harmonic termination circuits that are designed to at least partly terminate harmonics that may be generated during device operation such as second and third order harmonics. Termination of harmonics also influences intermodulation distortion products. The RF transistor amplifier die(s) as well as the impedance matching and harmonic termination circuits may be enclosed in a package. Electrical leads may extend from the package and are used to electrically connect the RF transistor amplifier to external circuit elements such as input and output RF transmission lines and bias voltage sources.

As noted above, Group III nitride-based RF transistor amplifiers are often used in high power and/or high frequency applications. Typically, high levels of heat are generated within the Group III nitride-based RF amplifier die(s) during operation. If the RF transistor amplifier die(s) become too hot, the performance (e.g., output power, efficiency, linearity, gain, etc.) of the RF transistor amplifier may deteriorate and/or the RF transistor amplifier die(s) may be damaged. As such, Group III nitride-based RF transistor amplifiers are typically mounted in packages that may be optimized for heat removal. FIGS. 1A and 1B illustrate a conventional packaged Group III nitride-based RF transistor amplifier. In particular, FIG. 1A is a schematic side view of a conventional packaged Group III nitride-based RF transistor amplifier 100, and FIG. 1B is a schematic cross-sectional view of the RF transistor amplifier die that is included in the packaged Group III nitride-based RF transistor amplifier 100, where the cross-section is taken along line 1B-1B of FIG. 1A. It will be appreciated that FIGS. 1A-1B (and various of the other figures) are highly simplified diagrams and that actual RF transistor amplifiers may include many more unit cells and various circuitry and elements that are not shown in the simplified figures herein.

As shown in FIG. 1A, the Group III nitride-based RF transistor amplifier 100 includes an RF transistor amplifier die 110 that is mounted within an open cavity package 170. The package 170 includes a gate lead 172, a drain lead 174, a metal flange 176 and a ceramic sidewall and lid 178. The RF transistor amplifier die 110 is mounted on the upper surface of the metal flange 176 in a cavity formed by the metal flange 176 and the ceramic sidewall and lid 178. The RF transistor amplifier die 110 has a top side 112 and a bottom side 114. The RF transistor amplifier die 110 includes a bottom side (also referred to as a "back" side) metallization structure 120, a semiconductor layer structure 130 and a top side metallization structure 140 that are sequentially stacked. The back side metallization structure 120 comprises a metal source terminal 126. The RF transistor amplifier 100 may be a HEMT-based RF transistor amplifier, in which case the semiconductor layer structure 130 may include at least a channel layer and a barrier layer, which are typically formed on a semiconductor or insulating growth substrate (such as a SiC or sapphire substrate). The growth substrate, even if formed of a non-semiconductor material, may be considered to be part of the semiconductor layer structure 130. The top side metallization structure 140 includes, among other things, a metal gate terminal 142 and a metal drain terminal 144.

Input matching circuits 190 and/or output matching circuits 192 may also be mounted within the housing 170. The matching circuits 190, 192 may be impedance matching circuits that match the impedance of the fundamental component of RF signals input to or output from the RF transistor amplifier 100 to the impedance at the input or output of the RF transistor amplifier die 110, respectively, and/or harmonic termination circuits that are configured to short to ground harmonics of the fundamental RF signal that may be present at the input or output of the RF transistor amplifier die 110, such as second order or third order harmonics. As schematically shown in FIG. 1A, the input and output matching circuits 190, 192 may be mounted on the metal flange 176. The gate lead 172 may be connected to the input matching circuit 190 by one or more first bond wires 182, and the input matching circuit 190 may be connected to the gate terminal 142 of RF amplifier die 110 by one or more second bond wires 183. Similarly, the drain lead 174 may be connected to the output matching circuit 192 by one or more fourth bond wires 185, and the output matching circuit 192 may be connected to the drain terminal 144 of RF amplifier die 110 by one or more third bond wires 184. The source terminal 126 of RF transistor amplifier die 110 may be mounted directly on the metal flange 176. The metal flange 176 may provide the electrical connection to the source terminal 126 and may also serve as a heat dissipation structure. The first through fourth bond wires 182-185 may form part of the input and/or output matching circuits. The housing 170 may comprise a ceramic housing, and the gate lead 172 and the drain lead 174 may extend through the housing 170. The housing 170 may comprise multiple pieces, such as a frame that forms the lower portion of the sidewalls and supports the gate and drain leads 172, 174, and a lid that is placed on top of the frame. The interior of the device may comprise an air-filled cavity.

FIG. 1B is a schematic cross-sectional view of the RF transistor amplifier die 110 that is taken through a portion of the top side metallization structure 140. Dielectric layers that isolate the various conductive elements of the top-side metallization structure 140 from each other are not shown in FIG. 1B to simplify the drawing.

As shown in FIG. 1B, the RF transistor amplifier die 110 comprises a Group III nitride-based HEMT RF transistor amplifier that has a plurality of unit cell transistors 116 that each include a gate finger 152, a drain finger 154 and a source finger 156. The gate fingers 152 are electrically connected to a common gate bus 146, and the drain fingers 154 are electrically connected to a common drain bus 148. The gate bus 146 is electrically connected to the gate terminal 142 (e.g., through a conductive via that extends upwardly from the gate bus 146) which is implemented as a gate bond pad (see FIG. 1A), and the drain bus 148 is electrically connected to the drain terminal 144 (e.g., through a conductive via that extends upwardly from the drain bus 148) which is implemented as a drain bond pad (see FIG. 1A). The source fingers 156 are electrically connected to the source terminal 126 via a plurality of conductive source vias 166 that extend through the semiconductor layer structure 130. The conductive source vias 166 may comprise metal-plated vias that extend completely through the semiconductor layer structure 130.

Referring again to FIG. 1A, the metal flange 176 may act as a heat sink that dissipates heat that is generated in the RF transistor amplifier die 110. The heat is primarily generated in the upper portion of the RF transistor amplifier die 110 where relatively high current densities are generated in, for example, the channel regions of the unit cell transistors 116. This heat may be transferred though the source vias 166 and the semiconductor layer structure 130 to the metal flange 176.

FIG. 1C is a schematic side view of a conventional packaged Group III nitride-based RF transistor amplifier 100' that is similar to the RF transistor amplifier discussed above with reference to FIG. 1A. RF transistor amplifier 100' differs from RF transistor amplifier 100 in that it includes a different package 170'. The package 170' includes a metal submount 176 (which acts as a metal heat sink and can be implemented as a metal slug), as well as gate and drain leads 172', 174'. In some embodiments, a metal lead frame may be formed that is then processed to provide the metal submount 176 and/or the gate and drain leads 172', 174'. RF transistor amplifier 100' also includes a plastic overmold 178' that at least partially surrounds the RF transistor amplifier die 110, the leads 172', 174' and the metal submount 176'. Depending on the embodiment, the packaged transistor amplifier 100' can include, for example, a monolithic microwave integrated circuit (MMIC) as the RF transistor amplifier die 110, in which case the input matching circuits 190 and/or the output matching circuits 192 may be omitted (since they may instead be implemented within the RF transistor amplifier die 110) and the bond wires 182 and/or 185 may extend directly from the gate and drain leads 172', 174' to the gate and drain terminals 142, 144. In some embodiments, the packaged RF transistor amplifier 100 can include multiple RF transistor amplifier die that are connected in series to form a multiple stage RF transistor amplifier and/or may include multiple transistor die that are disposed in multiple paths (e.g., in parallel) to form an RF transistor amplifier with multiple RF transistor amplifier die and multiple paths, such as in a Doherty amplifier configuration.

SUMMARY

Pursuant to embodiments of the present invention, RF transistor amplifiers are provided that include a Group III nitride-based RF transistor amplifier die that includes a semiconductor layer structure, a conductive source via that is connected to a source region of the Group III nitride-based RF transistor amplifier die, the conductive source via extending through the semiconductor layer structure, and an additional conductive via that extends through the semiconductor layer structure. A first end of the additional conductive via is connected to a first external circuit and a second end of the additional conductive via that is opposite the first end is connected to a first matching circuit.

In some embodiments, the additional conductive via may be a conductive gate via that is connected to a gate electrode of the Group III nitride-based RF transistor amplifier die, and the first matching circuit may be a first input matching circuit. In such embodiments, the Group III nitride-based RF transistor amplifier die may further include a conductive drain via that is connected to a drain finger of the Group III nitride-based RF transistor amplifier die, where a first end of the conductive drain via is connected to a second external circuit and a second end of the conductive drain via that is opposite the first end of the conductive drain via is connected to a first output matching circuit.

In some embodiments, the additional conductive via may be a conductive drain via that is connected to a drain finger of the Group III nitride-based RF transistor amplifier die, and the first matching circuit may be a first output matching circuit.

In some embodiments, the RF transistor amplifier may further include an interconnection structure, and the Group III nitride-based RF transistor amplifier die may be mounted on an upper surface of the interconnection structure. In some such embodiments, the first end of the conductive gate via may be a top end and the second end of the conductive gate via may be a bottom end that is electrically connected to a first conductive pad on the interconnection structure through a first contact such as a conductive bump or a die attach material. The first input matching circuit may comprise a capacitor that is coupled between the bottom end of the conductive gate via and electrical ground. The first input matching circuit may comprise a harmonic termination circuit, and the RF transistor amplifier may further include a second input impedance matching circuit that comprises a fundamental matching circuit that connects to the top end of the conductive gate via.

In other embodiments, the first end of the conductive gate via may be a bottom end that is electrically connected to a first conductive pad on the interconnection structure through a first contact, and the second end of the conductive gate via may be a top end. In such embodiments, the first input matching circuit may comprise a capacitor that is coupled between the top end of the conductive gate via and electrical ground. The first input matching circuit may comprise, for example, a harmonic termination circuit.

In some embodiments, the first end of the conductive drain via may be a top end and the second end of the conductive drain via may be a bottom end that is electrically connected to a second conductive pad on the interconnection structure through a second contact.

In some embodiments, the first output matching circuit may comprise a capacitor that is coupled between the bottom end of the conductive drain via and electrical ground.

In some embodiments, the first output matching circuit may comprise a fundamental impedance matching circuit, and the RF transistor amplifier may further include a second output matching circuit that comprises a harmonic termination matching circuit that connects to the top end of the conductive drain via.

In some embodiments, the first end of the conductive drain via may be a bottom end that is electrically connected to a first conductive pad on the interconnection structure through a first contact and the second end of the conductive drain via may be a top end.

In some embodiments, the first output matching circuit may comprise a capacitor that is coupled between the top end of the conductive drain via and electrical ground.

In some embodiments, the first input matching circuit may comprise a fundamental impedance matching circuit.

In some embodiments, the RF transistor amplifier may further include a interconnection structure, and the Group III nitride-based RF transistor amplifier die may be mounted on an upper surface of the interconnection structure. The RF transistor amplifier may also include a passive RF component that includes a capacitor mounted on the interconnection structure and electrically connected to the additional conductive via through the interconnection structure.

In some embodiments, the Group III nitride-based RF transistor amplifier die includes a plurality of parallel drain fingers and the conductive drain via is one of a plurality of drain vias, wherein at least two conductive drain vias are positioned underneath each of the conductive drain fingers. In such embodiments, the at least two conductive drain vias that are positioned underneath a first of the conductive drain fingers may define a first axis, and the at least two conductive drain vias that are positioned underneath a second of the conductive drain fingers that is adjacent the first of the conductive drain vias may define a second axis, and the conductive gate via may be positioned between the first axis and the second axis when the Group III nitride-based RF transistor amplifier die is viewed from above.

In some embodiments, the semiconductor layer structure may comprise a growth substrate, a channel layer and a barrier layer, where the channel layer is between the growth substrate and the barrier layer, wherein the conductive gate via and the conductive drain via are metal-plated vias that extend through all three of the growth substrate, the channel layer and the barrier layer.

In some embodiments, the conductive gate via, the conductive drain via and the conductive source via may all have substantially a same shape and substantially a same cross-sectional area.

In some embodiments, the additional conductive via may comprise a portion of the first matching circuit.

Pursuant to further embodiments of the present invention, RF transistor amplifiers are provided that include a Group III nitride-based RF transistor amplifier die that includes a semiconductor layer structure and a conductive via that extends through the semiconductor layer structure, a first impedance matching circuit coupled between a first end of the conductive via and a first external electrical connection, and a first harmonic termination circuit coupled between an opposed second end of the conductive via and a second external electrical connection.

In some embodiments, the conductive via may be a conductive gate via that is connected to a gate electrode of the Group III nitride-based RF transistor amplifier die, and the first end of the conductive gate via may be a top end that is adjacent the gate electrode and the second end of the conductive gate via may be a bottom end.

In some embodiments, the conductive via may be a conductive drain via that is connected to a drain electrode of the Group III nitride-based RF transistor amplifier die, and the first end of the conductive drain via may be a bottom end and the second end of the conductive drain via may be a top end that is adjacent the drain electrode.

In some embodiments, the RF amplifier may further comprise a conductive drain via that is connected to a drain electrode of the Group III nitride-based RF transistor amplifier die.

In some embodiments, the RF amplifier may further comprise a second impedance matching circuit coupled between a first end of the conductive drain via and a third external electrical connection.

In some embodiments, the first end of the conductive drain via may be a top end.

In some embodiments, the first end of the conductive drain via may be a bottom end.

In some embodiments, the RF amplifier may further comprise a redistribution layer ("RDL") laminate substrate, and the Group III nitride-based RF transistor amplifier die may be mounted on an upper surface of the RDL laminate substrate.

In some embodiments, the first end of the conductive via may be a top end and the second end of the conductive via may be a bottom end that is electrically connected to a first conductive pad on the RDL laminate substrate through a contact.

In some embodiments, the first harmonic termination circuit may comprise a capacitor that is coupled between the bottom end of the conductive via and electrical ground.

In some embodiments, the capacitor may be part of a passive RF component that is mounted on the RDL laminate substrate and electrically connected to the conductive via through the RDL laminate substrate.

In some embodiments, the semiconductor layer structure may comprise a growth substrate, a channel layer and a barrier layer, where the channel layer is between the growth substrate and the barrier layer, and the conductive gate via and the conductive drain via are metal-plated vias that extend through all three of the growth substrate, the channel layer and the barrier layer.

In some embodiments, the conductive gate via, the conductive drain via and the conductive source via may all have substantially a same shape and substantially a same cross-sectional area.

Pursuant to further embodiments of the present invention, RF transistor amplifiers are provided that include an RDL laminate substrate, a Group III nitride-based RF transistor amplifier die on a top surface of the RDL laminate substrate, the Group III nitride-based RF transistor amplifier die including a semiconductor layer structure that has a plurality of unit cell transistors in an upper portion thereof, a conductive source via, a conductive gate via, and a conductive drain via, each of which extends through the semiconductor layer structure, and a plurality of contacts on a bottom surface of the RDL laminate substrate.

In some embodiments, the contacts are arranged may be in a fan-in arrangement or in a fan-out arrangement.

In some embodiments, the RDL laminate substrate may include an upper gate pad that is electrically connected to the conductive gate via, an upper drain pad that is electrically connected to the conductive drain via, and an upper source pad that is electrically connected to the conductive source via.

In some embodiments, the RDL laminate substrate may further include a lower gate pad that is electrically connected to the upper gate pad, a lower drain pad that is electrically connected to the upper drain pad, and a lower source pad that is electrically connected to the upper source pad, and the contacts may include gate contacts that are mounted on the lower gate pad, drain contacts that are mounted on the lower drain pad, and source contacts that are mounted on the lower source pad.

In some embodiments, at least one of the gate contacts may be located outside the footprint of the Group III nitride-based RF transistor amplifier die when the RF amplifier is viewed from above.

In some embodiments, the Group III nitride-based RF transistor amplifier die may include a plurality of parallel drain fingers and the conductive drain via is one of a plurality of drain vias, an at least two conductive drain vias may be positioned underneath each of the conductive drain fingers. In such embodiments, the at least two conductive drain vias that are positioned underneath a first of the conductive drain fingers may define a first axis, and the at least two conductive drain vias that are positioned underneath a second of the conductive drain fingers that is adjacent the first of the conductive drain vias may define a second axis, and the conductive gate via may be positioned between the first axis and the second axis when the Group III nitride-based RF transistor amplifier die is viewed from above.

BRIEF DESCRIPTION OF THE DRAWINGS

FIG. 5A is a schematic cross-sectional view of an RF transistor amplifier die according to embodiments of the present invention that is mounted on a redistribution layer substrate in a fan-in topology.

DETAILED DESCRIPTION

Figure 1A:
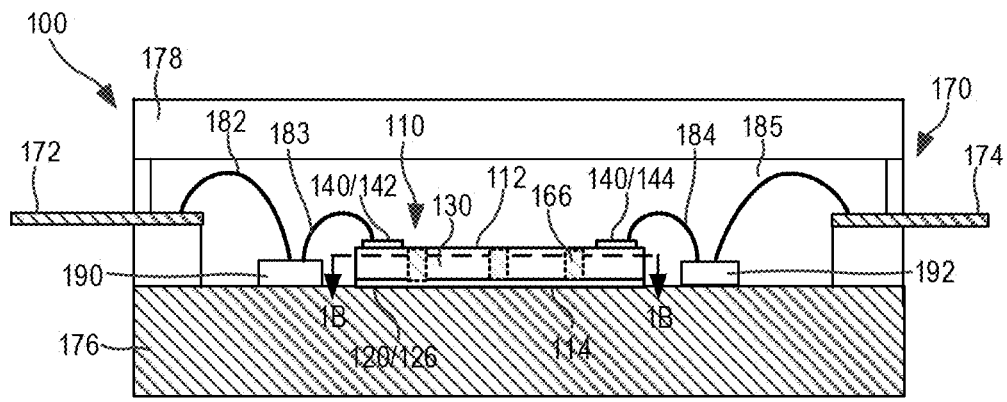
FIG. 1A is a schematic side view of a conventional Group III nitride-based RF transistor amplifier.
Figure 1B:
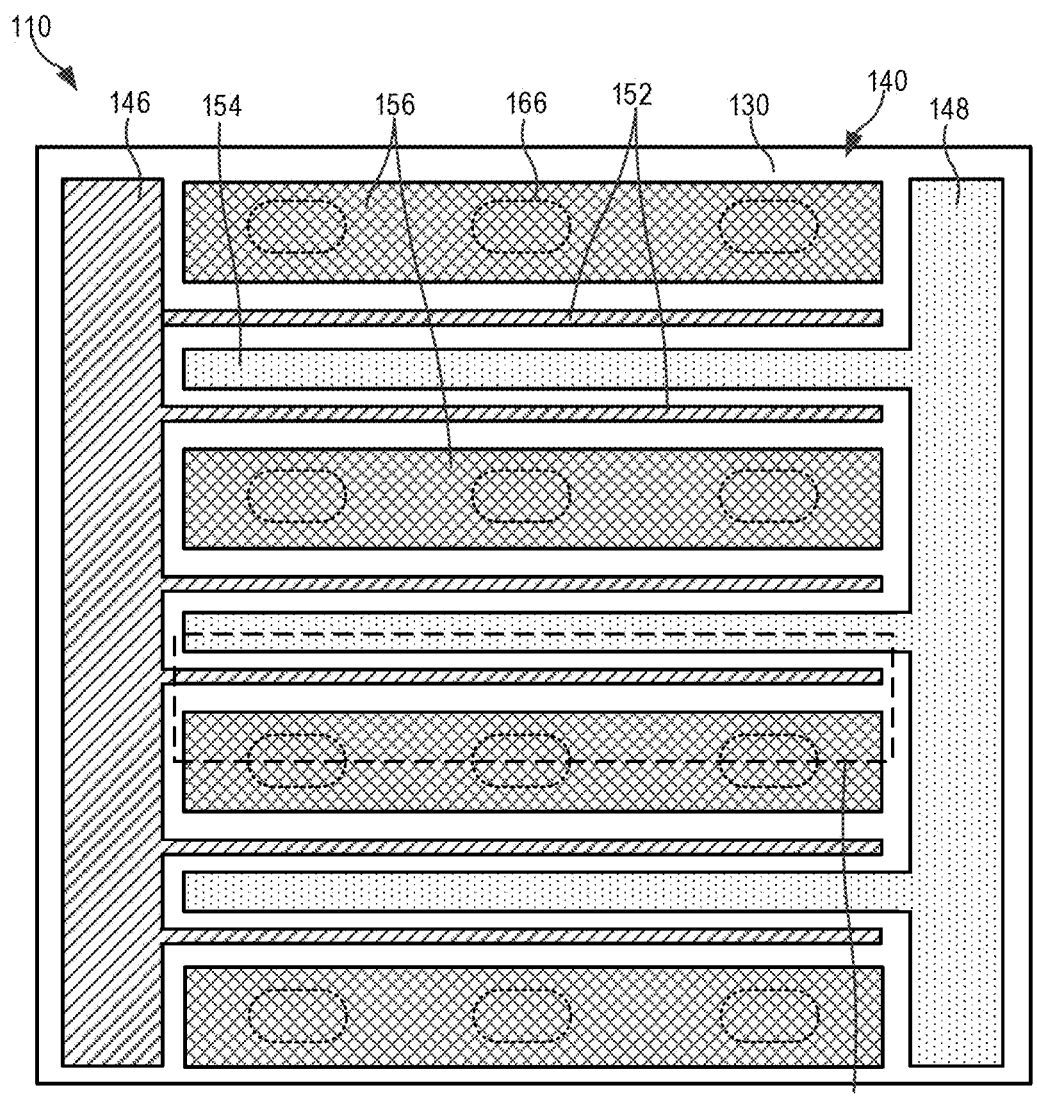
FIG. 1B is a schematic cross-sectional view taken along line 1B-1B of FIG. 1A that shows the structure of the top metallization of an RF transistor amplifier die that is included in the RF transistor amplifier of FIG. 1A.
Figure 1C:
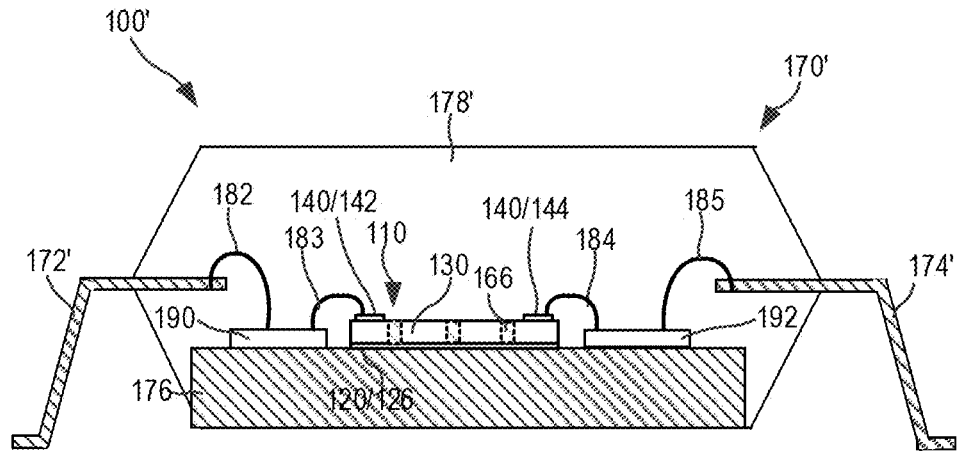
FIG. 1C is a schematic side view of another conventional Group III nitride-based RF transistor amplifier.

Conventional Group III nitride-based RF transistor amplifiers, such as the RF transistor amplifier 100 of FIGS. 1A-1B, may use bond wires to connect the RF transistor amplifier die 110 to gate and drain leads 172, 174. These bond wires have inherent inductance that may be used to implement some of the inductors in the impedance matching and/or harmonic termination circuits of the RF transistor amplifiers. The amount of inductance provided may be varied by changing the length and/or the cross-sectional area (e.g., the diameter) of the bond wires so that the bond wires provide a desired amount of inductance. Unfortunately, as applications move to higher frequencies, the inductance of the bond wires may exceed a desired amount of inductance for the impedance matching and/or harmonic termination circuits. When this occurs, bond wires that are very short and/or that have large cross-sectional areas may be used in an effort to decrease the inductance thereof to suitable levels. Very short bond wires, however, may be difficult to solder in place, which may increase manufacturing costs, and/or may result in higher device failure rates. Bond wires having large cross-sectional areas may require larger gate and drain bond pads on the RF transistor amplifier die, which require an increase in the overall size of the RF transistor amplifier die, which is also undesirable. Moreover, in some higher frequency applications, even very short bond wires having large cross-sectional areas may have too much inductance such that the matching networks cannot, for example, properly terminate the second or third order harmonics. While the RF transistor amplifiers may be implemented as MMIC devices in order to avoid the problem of too much inductance in the bond wires, MMIC RF amplifiers are more expensive to fabricate and can only be used in the frequency range of the matching circuits, reducing flexibility.

Pursuant to embodiments of the present invention, Group III nitride-based RF transistor amplifiers are provided that include RF transistor amplifier dies that have source terminals and at least one of their drain terminals and/or their gate terminals all located on the back side of the RF transistor amplifier die. The gate, drain and source terminals may all be connected to corresponding gate, drain and source pads on an interconnection structure using conductive contacts such as, for example, conductive bump technology (e.g., solder bumps), die attach material, conductive epoxies, or other low inductance electrical connections. In some embodiments, the RF transistor amplifiers may not include any bond wires. The RF amplifier die may include one or more conductive gate vias and/or one or more conductive drain vias that are used to connect a gate bus and/or a drain bus that are on the top side of the RF transistor amplifier die to the respective gate and drain terminals that are on the back side of the RF transistor amplifier die. The length of the conductive vias may be a small fraction (e.g., 10-30%) of the length of conventional bond wires, and hence the inductance of the connections between the gate and drain buses and the interconnection structure may be reduced significantly. As a result, the impedance matching and/or harmonic termination circuits may be configured to have a desired amount of inductance without the need for implementing the RF transistor amplifier as a MMIC device. Thus, the size of the RF transistor amplifier dies may be reduced without compromising the performance thereof, and the RF transistor amplifier dies can be used for applications in a variety of different frequency bands, as the frequency-specific portions of the device (e.g., the matching circuits) may be implemented as separate chips or circuits.

Moreover, the wire bonding equipment that is typically used for high volume manufacturing may have a tolerance of +/−1 mil, meaning that the length of any particular wire bond may vary by as much a 4 mils (i.e., +/−1 mil on each end of the bond wire). For high frequency applications, the variation in inductance associated with 4 mils of wire bond may be significant, and hence the performance of the matching circuits may be degraded if the bond wires are 1-2 mils too short or long from a desired nominal length. Forming the gate and drain terminals on the back side of the device and using contacts to connect these terminals to corresponding pads on the interconnection structure may largely eliminate this process variation, resulting in improved performance.

Pursuant to some embodiments of the present invention, RF transistor amplifiers are provided that include an interconnection structure and a Group III nitride-based RF transistor amplifier die that is mounted on top of interconnection structure. The Group III nitride-based RF transistor amplifier die includes a semiconductor layer structure. A plurality of unit cell transistors are provided in an upper portion of the semiconductor layer structure, and a gate terminal, a drain terminal and a source terminal are provided on a lower surface of the semiconductor layer structure that is adjacent the interconnection structure. The gate terminal is electrically connected to the unit cell transistors through one or more conductive gate vias, the drain terminal is electrically connected to the unit cell transistors through one or more conductive drain vias, and the source terminal is electrically connected to the unit cell transistors through one or more conductive source vias. The gate, drain and source vias may extend completely through the semiconductor layer structure.

In some embodiments, the RF transistor amplifiers may comprise a Group III nitride-based RF transistor amplifier die that has a semiconductor layer structure having a source region therein, a conductive source via and an additional conductive via that each extend through the semiconductor layer structure. A first end of the additional conductive via is connected to a first external circuit and a second, opposed end of the additional conductive via is connected to a first matching circuit. The additional conductive via can be a conductive gate via that is connected to a gate electrode or a conductive drain via that is connected to a drain electrode of the RF transistor amplifier die.

In other embodiments, the RF transistor amplifier may comprise a Group III nitride-based RF transistor amplifier die that includes a semiconductor layer structure and a conductive via that extends through the semiconductor layer structure. A first impedance matching circuit is coupled between a first end of the conductive via and a first external electrical connection and a first harmonic termination circuit is coupled between a second opposed end of the additional conductive via and a second external electrical connection.

In still other embodiments, the RF transistor amplifier comprises (1) an interconnection structure such as, for example, a redistribution layer ("RDL") laminate substrate, a printed circuit board, an interposer or a substrate having a dielectric layer or pattern on a surface thereof with conductive traces on the dielectric pattern/layer opposite the substrate and (2) a Group III nitride-based RF transistor amplifier die on a top surface of the interconnection structure. The Group III nitride-based RF transistor amplifier die includes a semiconductor layer structure that has a plurality of unit cell transistors in an upper portion thereof, a conductive source via, a conductive gate via, and a conductive drain via, each of which extends through the semiconductor layer structure, and a plurality of contacts on a bottom surface of the RDL laminate substrate.

Embodiments of the present invention will now be discussed in further detail with reference to the accompanying figures.

Figure 2A:
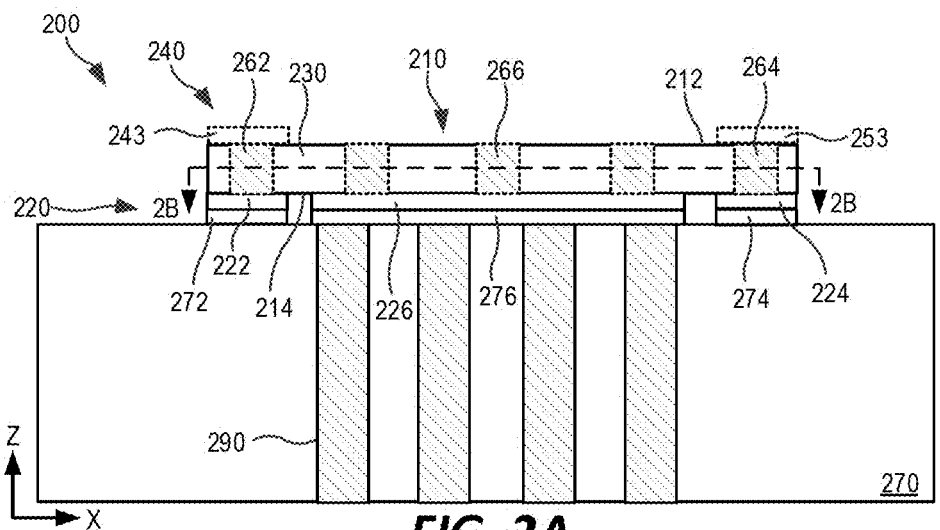
FIG. 2A is a schematic side view of a Group III nitride-based RF transistor amplifier according to embodiments of the present invention.
Figure 2B:
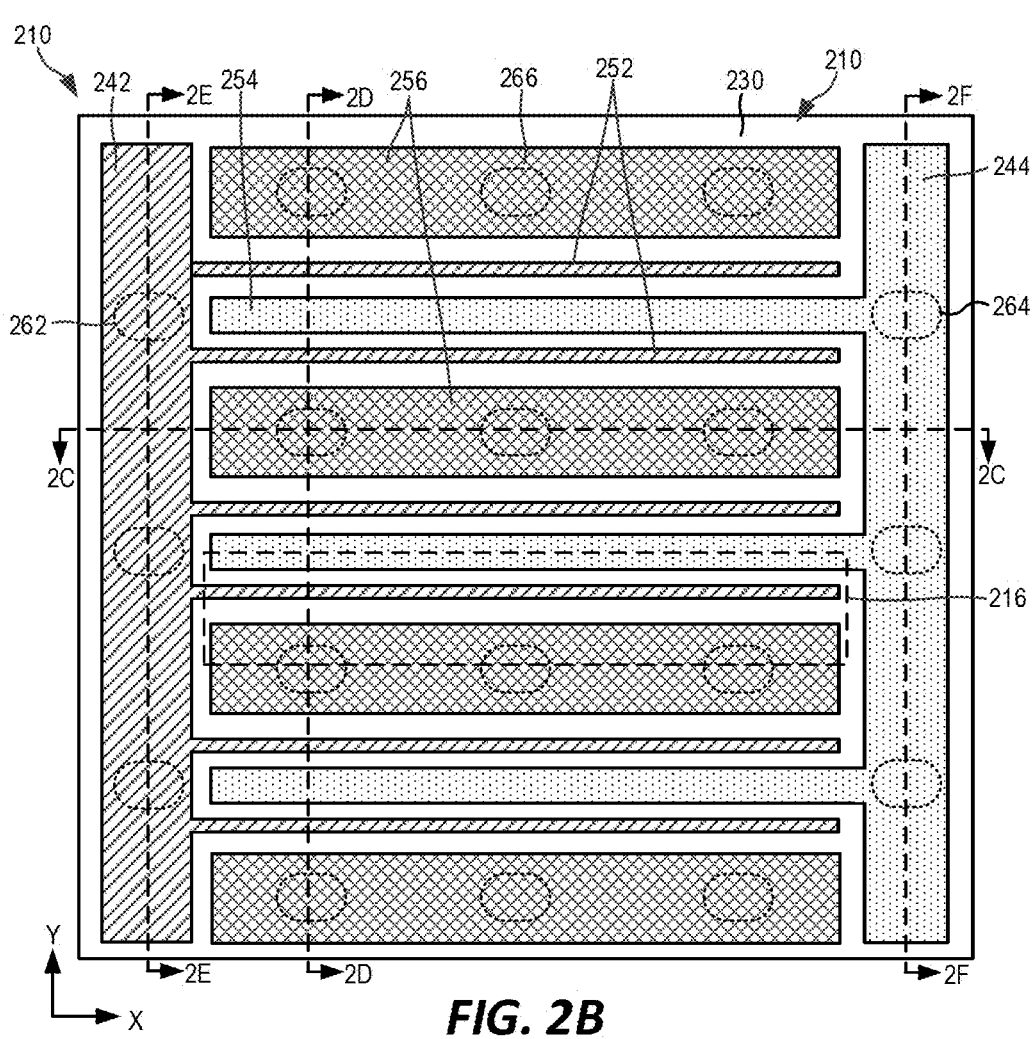
FIG. 2B is a schematic cross-sectional view taken along line 2B-2B of FIG. 2A that shows the structure of the top metallization of an RF transistor amplifier die that is included in the RF transistor amplifier of FIG. 2A.
Figure 2C:
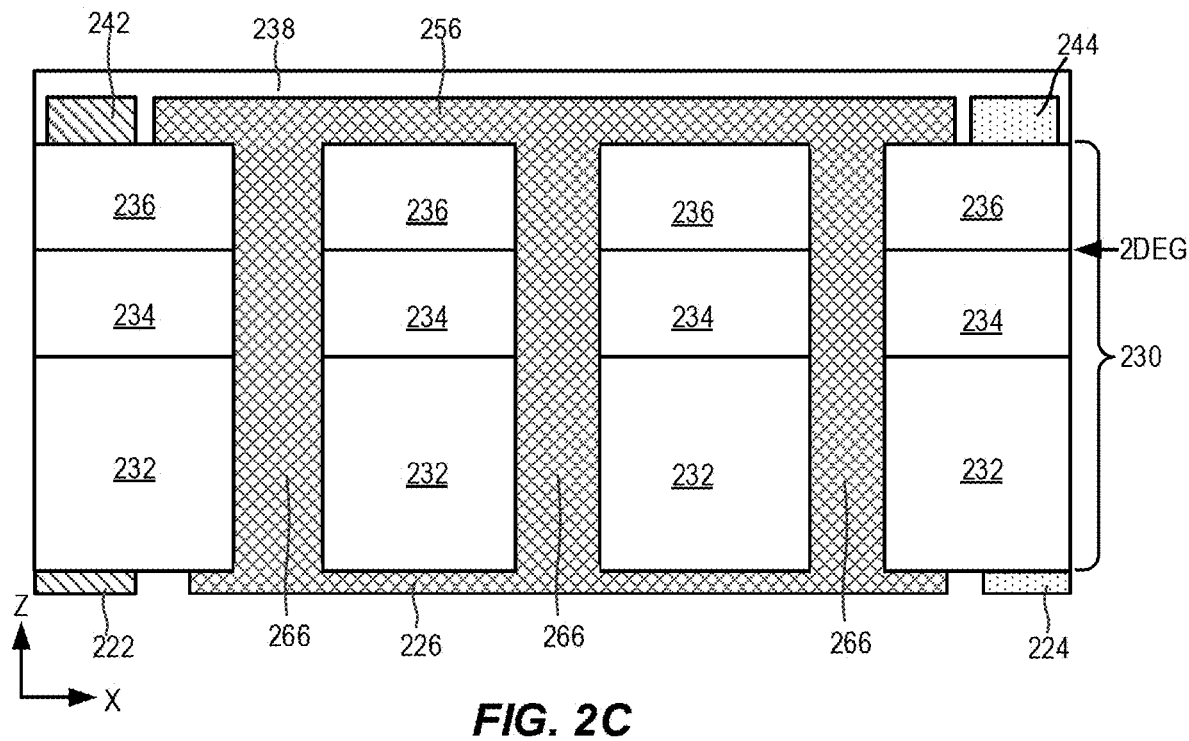
FIG. 2C is a cross-sectional view taken along line 2C-2C of FIG. 2B.
Figure 2D:
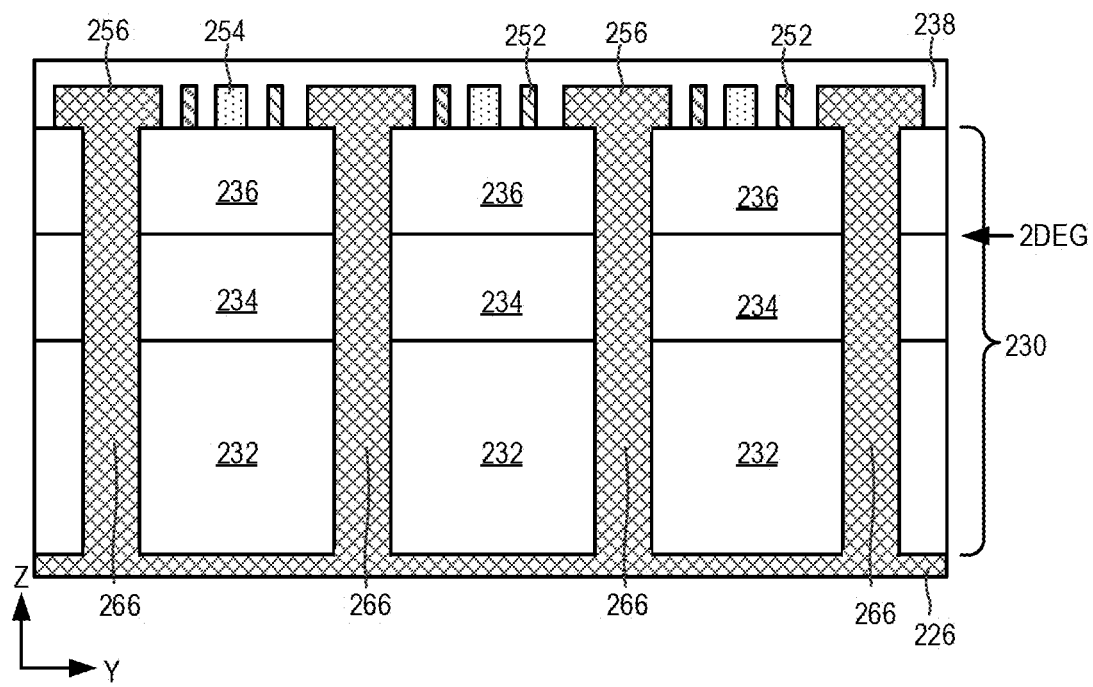
FIG. 2D is a cross-sectional view taken along line 2D-2D of FIG. 2B.
Figure 2E:
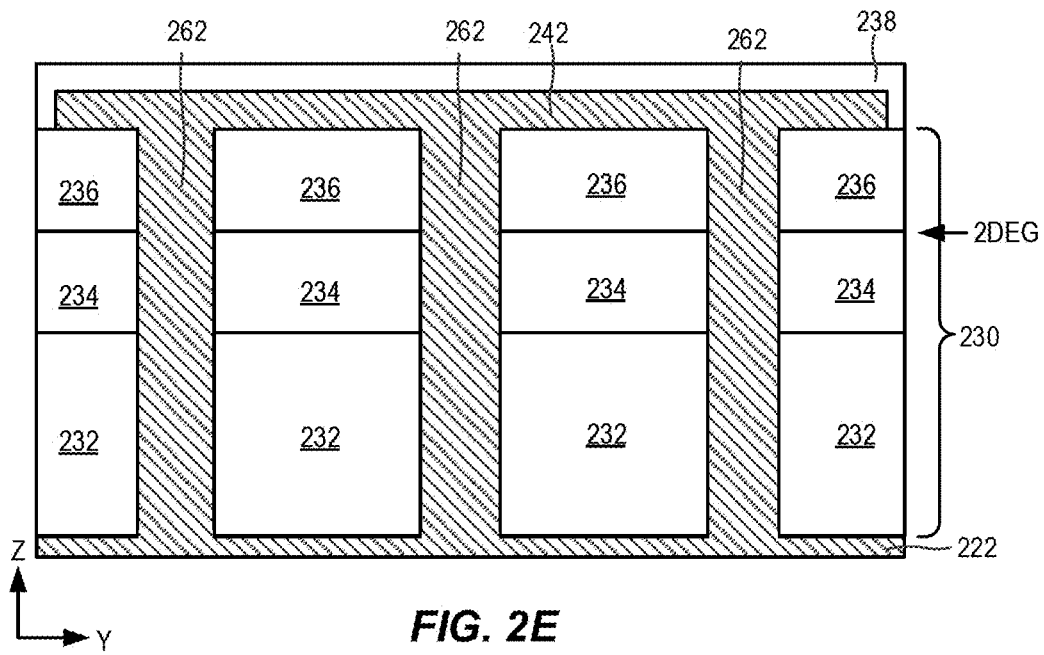
FIG. 2E is a cross-sectional view taken along line 2E-2E of FIG. 2B.
Figure 2F:
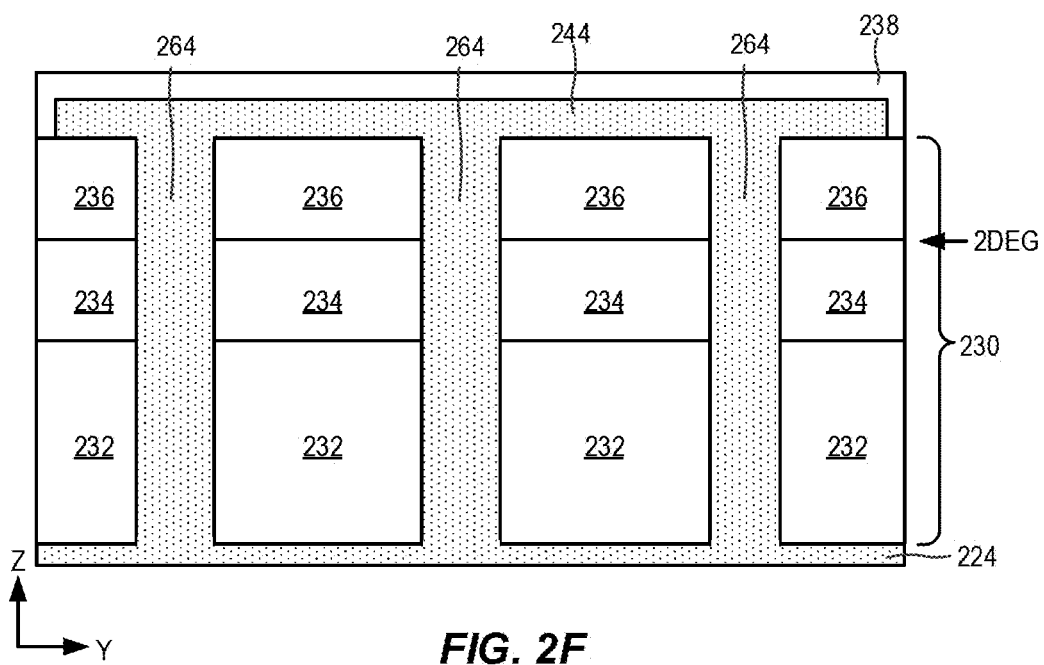
FIG. 2F is a cross-sectional view taken along line 2F-2F of FIG. 2B.
Figure 2G:
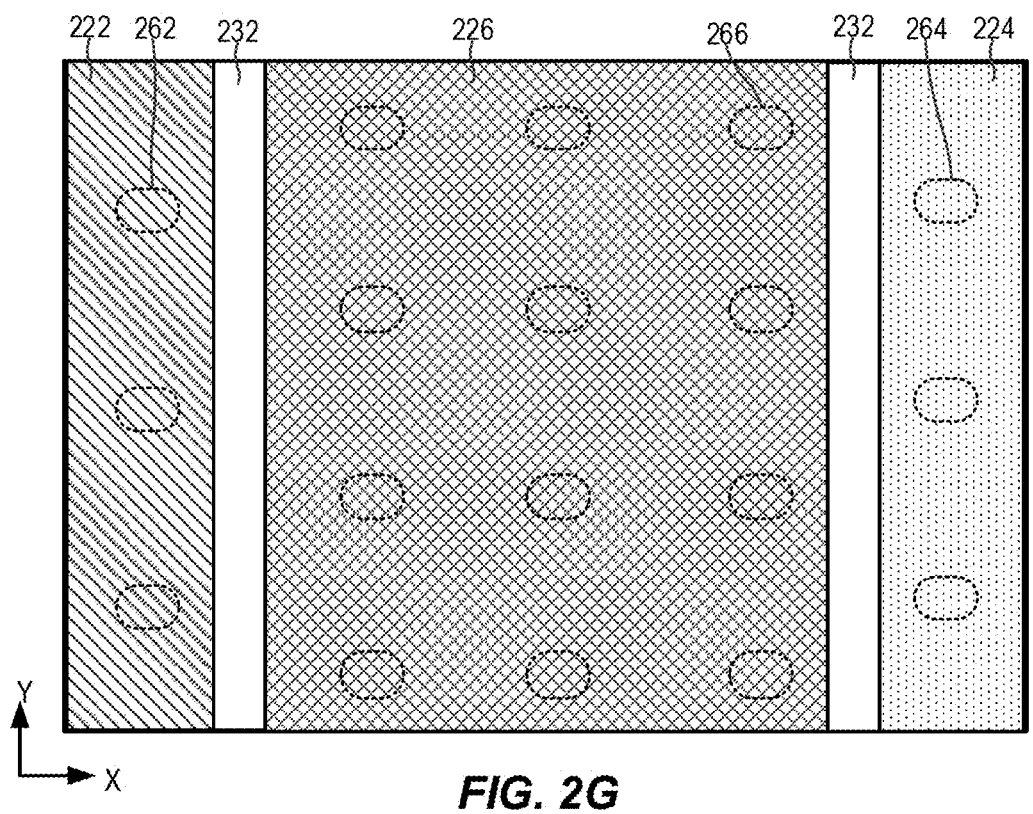
FIG. 2G is a schematic back side view of the RF transistor amplifier die included in the Group III nitride-based RF transistor amplifier of FIG. 2A.

FIGS. 2A-2G depict a Group III nitride-based RF transistor amplifier 200 according to certain embodiments of the present invention. In particular, FIG. 2A is a schematic side view of the Group III nitride-based RF transistor amplifier 200. FIG. 2B is a schematic cross-sectional view of an RF transistor amplifier die 210 that is part of the Group III nitride-based RF transistor amplifier 200 of FIG. 2A that is taken along line 2B-2B of FIG. 2A. FIGS. 2C through 2F are schematic cross-sectional views of the RF transistor amplifier die 210 that are taken along lines 2C-2C through 2F-2F of FIG. 2B, respectively. Finally, FIG. 2G is a schematic bottom view of the RF transistor amplifier die 210.

As shown in FIG. 2A, the Group III nitride-based RF transistor amplifier 200 includes an RF transistor amplifier die 210 that is mounted on the upper surface of an interconnection structure 270. The RF transistor amplifier die 210 has a top side 212 and a bottom side 214. The RF transistor amplifier die 210 includes a bottom side metallization structure 220, a semiconductor layer structure 230, and a top side metallization structure 240 that are sequentially stacked. The bottom side metallization structure 220 comprises a gate terminal 222, a drain terminal 224, and a source terminal 226. The RF transistor amplifier 200 may be a HEMT-based RF transistor amplifier, in which case the semiconductor layer structure 230 may include at least a channel layer and a barrier layer, as will be discussed in greater detail with reference to FIGS. 2C and 2D. The top side metallization structure 240 will be discussed in greater detail with reference to FIG. 2B.

The interconnection structure 270 may comprise any structure that is electrically connected to the RF transistor amplifier die 210 that provides a suitable mounting surface for the RF transistor amplifier die 210. In some cases, the interconnection structure 270 may comprise an RDL laminate structure. An RDL laminate structure refers to a substrate that has conductive layer patterns and/or conductive vias for electrical and/or thermal interconnection. RDL laminate structures may be fabricated using semiconductor processing techniques by depositing conductive and insulating layers and/or patterns on a base material and by forming vias and copper routing patterns within the structure for transmitting signals through the RDL laminate structure. Other interconnection structures 270 may alternatively be used such as, for example, a printed circuit board (e.g., a multi-layer printed circuit board), a metal core printed circuit board, or a ceramic substrate that includes conductive vias and/or pads. In still other embodiments, the interconnection structure 270 may comprise a metal flange that has an insulating pattern on a top surface thereof, and conductive traces on the insulating layer that, for example, provide electrical connections to the gate terminal 222 and the drain terminal 224. The source terminal 226 may be electrically connected to the metal flange via, for example, electrically conductive die attach material such as solder. In some embodiments, the insulating pattern formed on the top surface of the metal flange may be a solder mask layer. In any event, it will be appreciated that the interconnection structure 270 may be any suitable mounting surface for the RF transistor amplifier die 210 that can make electrical connections to the back side 214 of the RF transistor amplifier die 210. More than one interconnection structure 270 may be provided in a stacked manner. The RF transistor amplifier die 210 may be mounted on the interconnection structure 270 (e.g., on an RDL laminate structure) by the die manufacturer. In other cases, the RF transistor amplifier die 210 may be directly mounted in a package on a package submount, such as a metal flange, where dielectric and traces are formed on the metal flange so that the metal flange can act as interconnection structure 270.

A gate pad 272, a drain pad 274 and a source pad 276 are provided on the top surface of the interconnection structure 270. Each of these pads 272, 274, 276 may comprise, for example, an exposed copper pad. The gate terminal 222 may overlap the gate pad 272 along a first vertical axis that extends perpendicular to the top surface of the semiconductor layer structure 230, the drain terminal 224 may overlap the drain pad 274 along a second vertical axis that extends perpendicular to the top surface of the semiconductor layer structure 230, and the source terminal 226 may overlap the source pad 276 along a third vertical axis that extends perpendicular to the top surface of the semiconductor layer structure 230. By "overlap" it is meant that the axis extends through both the terminal and its corresponding pad, and "vertical" refers to a direction that is perpendicular to a major surface of the semiconductor layer structure 230. Each overlapping terminal and pad (e.g., gate terminal 222 and gate pad 272) may be physically and electrically connected to each other by any suitable contacts including, for example, a conductive bump (e.g., a solder bump or a conductive epoxy), a die attach material, or the like (not shown). It will be appreciated that any type of bump grid array technology may be used to connect the gate, drain and source terminals 222, 224, 226 to the respective gate, drain and source pads 272, 274, 276 while facilitating dissipation of heat from the RF amplifier die 210. The interconnection structure 270 may further includes a plurality of heat dissipation structures 290. In the depicted embodiment, the heat dissipation structures 290 comprise metal-filled (or partly metal-filled) vias that extend through the interconnection structure 270. Heat that is generated in the RF transistor amplifier die 210 may be dissipated through the metal-filled vias 290.

The RF transistor amplifier die 210 may comprise a Group III nitride-based HEMT RF transistor amplifier that includes a plurality of unit cell transistors 216 that are electrically connected to each other in parallel. This can best be seen in FIG. 2B, which schematically depicts a cut through the top side metallization structure 240 of RF transistor amplifier die 210. As shown in FIG. 2B, the top side metallization structure 240 includes a gate bus 242 and a drain bus 244, a plurality of gate fingers 252, a plurality of drain fingers 254 and a plurality of source fingers 256, all of which may be formed on an upper surface of the semiconductor layer structure 230. The gate bus 242 and gate fingers 252 are part of a gate electrode of the RF transistor amplifier die 210. The gate bus 242 and the gate fingers 252 may be implemented as a first monolithic metal pattern. The drain bus 244 and drain fingers 254 are part of a drain electrode of the RF transistor amplifier die 210, and may be implemented as a second monolithic metal pattern. The gate fingers 252 may be formed of materials that are capable of making a Schottky contact to a Group III nitride-based semiconductor material, such as Ni, Pt, Cu, Pd, Cr, W and/or WSiN. The drain fingers 254 and source fingers 256 may include a metal, such as TiAlN, that can form an ohmic contact to Group III nitride-based materials. A dielectric layer (or a series of dielectric layers) that help isolate the gate metallization 242, 252, the drain metallization 244, 254 and the source metallization 256 from each other is not shown in FIG. 2B to better illustrate the elements of the top side metallization structure 240. A conductive gate bond pad 243 and/or a conductive drain bond pad 253 may optionally be provided on the upper surface of the RF transistor amplifier die 210. The gate bond pad 243 may be electrically connected to the gate terminal 222, and the drain bond pad 253 may be electrically connected to the drain terminal 224.

One of the unit cell transistors 216 is also shown in FIG. 2B. As shown, the unit cell transistor 216 includes a gate finger 252, a drain finger 254 and a source finger 256 along with the underlying portion of the semiconductor layer structure 230. Since all of the gate fingers 252 are electrically connected to a common gate bus 242, all of the drain fingers 254 are electrically connected to a common drain bus 244, and all of the source fingers 256 are electrically connected together via the conductive source vias 266 (discussed below) and the source terminal 226, it can be seen that the unit cell transistors 216 are all electrically connected together in parallel.

The unit cell transistors 216 may by HEMT devices. Suitable structures for Group III-nitride-based HEMT devices that may utilize embodiments of the present invention are described, for example, in commonly assigned U.S. Patent Publication No. 2002/0066908A1 published Jun. 6, 2002, for "Aluminum Gallium Nitride/Gallium Nitride High Electron Mobility Transistors Having A Gate Contact On A Gallium Nitride Based Cap Segment And Methods Of Fabricating Same," U.S. Patent Publication No. 2002/0167023A1 for "Group-III Nitride Based High Electron Mobility Transistor (HEMT) With Barrier/Spacer Layer," published Nov. 14, 2002, U.S. Patent Publication No. 2004/0061129 for "Nitride-Based Transistors And Methods Of Fabrication Thereof Using Non-Etched Contact Recesses," published on Apr. 1, 2004, U.S. Pat. No. 7,906,799 for "Nitride-Based Transistors With A Protective Layer And A Low-Damage Recess" issued Mar. 15, 2011, and U.S. Pat. No. 6,316,793 entitled "Nitride Based Transistors On Semi-Insulating Silicon Carbide Substrates," issued Nov. 13, 2001, the disclosures of which are hereby incorporated herein by reference in their entirety.

As is further shown in FIG. 2B, a plurality of metal-plated vias are provided that extend from the top metallization structure 240 through the semiconductor layer structure 230. The metal-plated vias include metal-plated gate vias 262, metal-plated drain vias 264, and metal-plated source vias 266. The metal-plated gate vias 262 physically and electrically connect the gate bus 242 to the gate terminal 222, the metal-plated drain vias 264 physically and electrically connect the drain bus 244 to the drain terminal 224, and metal-plated source vias 262 physically and electrically connect the source fingers 256 to the source terminal 226.

As is further shown in FIG. 2B, the conductive gate vias 262 and/or the conductive drain vias 264 may be offset (in the Y-direction of FIG. 2B) from the conductive source vias 266. In particular, two or more conductive source vias 266 may be formed in each source finger 256, and the conductive source vias 266 that are formed in a particular source finger 256 may extend (at least generally) along a horizontal (X-direction) axis. Thus, the conductive source vias 266 included in each source finger 256 may define respective horizontal axes in the view of FIG. 2B, with line 2C-2C in FIG. 2B illustrating one such horizontal axis. As shown in FIG. 2B, the conductive gate vias 262 and/or the conductive drain vias 264 may be positioned between these horizontal axes (as opposed to, for example, being aligned along these horizontal axes). In some cases, the conductive gate vias 262 and/or the conductive drain vias 264 may be positioned along the longitudinal axes defined by the respective drain fingers 254. Offsetting the conductive gate vias 262 and the conductive drain vias 264 from the conductive source vias 266 may increase the distance between conductive vias, 262, 264, 266, which can reduce the possibility that the wafer or die cracks due to mechanical weaknesses. This arrangement also reduces parasitic gate-to-source and/or parasitic source-to-drain coupling that may occur between the various vias 262, 264, 266. Such parasitic coupling may lead to gain loss and/or instability.

Referring to FIGS. 2C and 2D, the semiconductor layer structure 230 includes a plurality of semiconductor layers. In the depicted embodiment, a total of two semiconductor layers are shown, namely a channel layer 234 and a barrier layer 236 that is on a top side of the channel layer 234. The semiconductor layer structure 230 may include additional semiconductor and/or non-semiconductor layers. For example, the semiconductor layer structure 230 may include a growth substrate 232 on which the other semiconductor layers are grown. The growth substrate 232 may comprise, for example, a 4H-SiC or 6H-SiC substrate. In other embodiments, the growth substrate may be comprise a different semiconductor material (e.g., silicon or a Group III nitride-based material, GaAs, ZnO, InP) or a non-semiconductor material (e.g., sapphire).

SiC has a much closer crystal lattice match to Group III nitrides than does sapphire ($Al_2O_3$), which is a very common substrate material for Group III nitride devices. The closer lattice match of SiC may result in Group III nitride films of higher quality than those generally available on sapphire. SiC also has a very high thermal conductivity so that the total output power of Group III nitride devices on silicon carbide is, typically, not as limited by thermal dissipation of the substrate as in the case of the same devices formed on sapphire. Also, the availability of semi-insulating SiC substrates may provide for device isolation and reduced parasitic capacitance.

Optional buffer, nucleation and/or transition layers (not shown) may be provided on the growth substrate 232 beneath the channel layer 234. For example, an AlN buffer layer may be included to provide an appropriate crystal structure transition between a SiC growth substrate 232 and the remainder of the semiconductor layer structure 230. Additionally, strain balancing transition layer(s) may also be provided as described, for example, in commonly assigned U.S. Patent Publication 2003/0102482A1, published Jun. 5, 2003, and entitled "Strain Balanced Nitride Heterojunction Transistors And Methods Of Fabricating Strain Balanced Nitride Heterojunction Transistors," the disclosure of which is incorporated herein by reference as if set forth fully herein.

In some embodiments, the channel layer 234 is a Group III nitride material, such as $Al_xGa_{1-x}N$ where $0 \leq x < 1$, provided that the energy of the conduction band edge of the channel layer 234 is less than the energy of the conduction band edge of the barrier layer 236 at the interface between the channel and barrier layers 234, 236. In certain embodiments of the present invention, x=0, indicating that the channel layer 234 is gallium nitride ("GaN"). The channel layer 234 may also be other Group III nitrides such as InGaN, AlInGaN or the like. The channel layer 234 may be undoped or unintentionally doped and may be grown to a thickness of, for example, greater than about 20 Å. The channel layer 234 may also be a multi-layer structure, such as a superlattice or combinations of GaN, AlGaN or the like.

The channel layer 234 may have a bandgap that is less than the bandgap of at least a portion of the barrier layer 236, and the channel layer 234 may also have a larger electron affinity than the barrier layer 236. In certain embodiments, the barrier layer 236 is AlN, AlInN, AlGaN or AlInGaN with a thickness of between about 0.1 nm and about 10 nm or more. In particular embodiments, the barrier layer 236 is thick enough and has a high enough Al composition and doping to induce a significant carrier concentration at the interface between the channel layer 234 and the barrier layer 236.

The barrier layer 236 may be a Group III nitride and may have a bandgap larger than that of the channel layer 234 and a smaller electron affinity than the channel layer 234. In certain embodiments, the barrier layer 236 is undoped or doped with an n-type dopant to a concentration less than about $10^{19}$ cm$^{-3}$. In some embodiments of the present invention, the barrier layer 236 is $Al_xGa_{1-x}N$ where $0 < x < 1$. In particular embodiments, the aluminum concentration is about 25%. However, in other embodiments of the present invention, the barrier layer 236 comprises AlGaN with an aluminum concentration of between about 5% and about 100%. In specific embodiments of the present invention, the aluminum concentration is greater than about 10%.

Due to the difference in bandgap between the barrier layer 236 and the channel layer 234 and piezoelectric effects at the interface between the barrier layer 236 and the channel layer 234, a two dimensional electron gas (2DEG) is induced in the channel layer 234 at a junction between the channel layer 234 and the barrier layer 236. The 2DEG acts as a highly conductive layer that allows conduction between the source region of each unit cell transistor 216 and its associated drain region, where the source region is the portion of the semiconductor layer structure 230 that is directly underneath the source finger 256 and the drain region is the portion of the semiconductor layer structure 230 that is directly underneath the corresponding drain finger 254.

An interlayer insulating layer 238 is formed over the gate fingers 252, the drain fingers 254, and the source fingers 256. The interlayer insulating layer 238 may include a dielectric material, such as SiN, $SiO_2$, etc.

FIGS. 2C-2G illustrate the metal-plated gate vias 262, metal-plated drain vias 264, and metal-plated source vias 266 in more detail. As shown in FIGS. 2C through 2F, the metal-plated gate vias 262, metal-plated drain vias 264, and metal-plated source vias 266 may extend the entire way through the semiconductor layer structure 230 in order to physically and electrically connect the gate bus 242 to the gate terminal 222, the drain bus 244 to the drain terminal 224, and the source fingers 256 to the source terminal 226.

In some embodiments, the metal-plated gate vias 262, metal-plated drain vias 264, and metal-plated source vias 266 may all have the same shape and horizontal cross-section (i.e., a cross-section taken through the vias in a plane that is parallel to a major surface of the semiconductor layer structure 230). For example, all of the vias 262, 264, 266 may be substantially cylindrical or oval vias having the same diameter, or may all be truncated fustoconical vias that have the same diameter when measured at the same height above the bottom surface 214 of the RF amplifier die 210. Such an arrangement may allow all of the vias 262, 264, 266 to be readily formed in a single manufacturing step. In other embodiments, the metal-plated gate vias 262 and/or the metal-plated drain vias 264 may have a larger cross-sectional area as compared to the metal-plated source vias 266. This technique may be used to further reduce the inherent inductance of the metal-plated gate vias 262 and/or the metal-plated drain vias 264 if necessary for certain applications.

The metal-plated gate vias 262, metal-plated drain vias 264, and metal-plated source vias 266 may each be implemented by forming openings though the semiconductor layer structure (e.g., by anisotropic etching) and by then depositing metal-plating that coats the sidewalls of the openings. In some applications, the metal may completely fill the openings so that the metal-plated vias are metal-filled vias. However, in many applications, the RF transistor amplifier die 210 may operate over a wide temperature range (due to outdoor applications and/or the high levels of heat that may be generated within the RF transistor amplifier die during device operation), which may lead to high stress levels in the device due to the metal and semiconductor materials having significantly different coefficients of thermal expansion. In such cases, the center of the metal-plated vias 262, 264, 266 may be left open (i.e., air-filled) in order to reduce the amount of stress that occurs due to thermal cycling.

The cross-sectional areas of the vias 262, 264, 266 may be selected, for example, based on heat dissipation considerations and/or a desired amount of series inductance. Whether a metal-plated via will dissipate more or less heat than the semiconductor material that the metal-plated via penetrates will depend upon a variety of considerations, including the thermal dissipation qualities of the semiconductor material and the metal used, the thickness of the metal plating, the cross-sectional area(s) of the vias, etc. Generally speaking, metals such as copper dissipate heat more efficiently than Group III nitride-based and silicon carbide semiconductor materials, but any central air-filled opening in the vias will dissipate heat less efficiently than the semiconductor materials.

As shown in FIG. 2G, the gate terminal 222, the drain terminal 224 and the source terminal 226 may each comprise a metallization pattern on a lower surface of the semiconductor layer structure 230. Gaps may be provided between the gate terminal 222 and the drain terminal 224 and between the drain terminal 224 and the source terminal 226 in order to electrically insulate the gate, drain and source terminals 222, 224, 226 from each other. These gaps may expose the growth substrate 232 when the RF transistor amplifier die 210 is viewed from the back side. In some embodiments, an insulating pattern (not shown) may be deposited in the gaps. The gate vias 262, the drain vias 264 and the source vias 266 each physically and electrically connect to the respective gate terminal 222, drain terminal 224 and source terminal 226.

Figure 3:
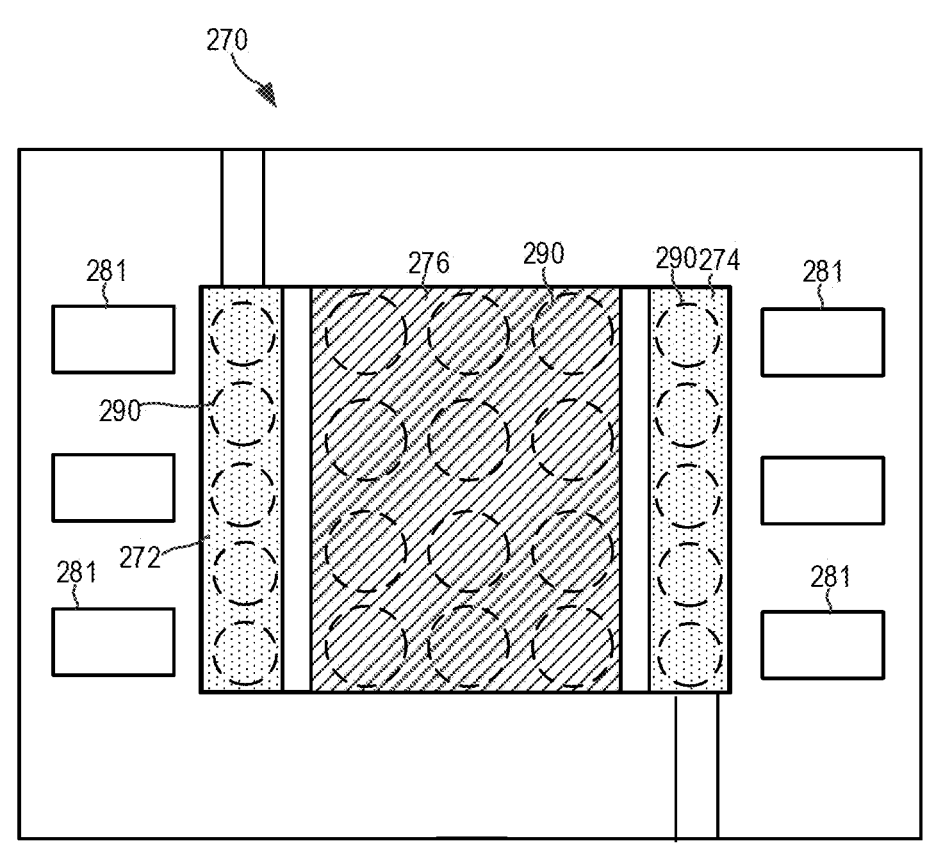
FIG. 3 is a plan view of an embodiment of an interconnection structure that may be used in the RF transistor amplifier of FIGS. 2A-2G.

FIG. 3 is a schematic top view of an example embodiment of the interconnection structure 270 included in the RF amplifier 200 of FIGS. 2A-2G. As discussed above, the interconnection structure 270 may comprise, for example, an RDL laminate structure or a multilayer printed circuit board. The gate pad 272, drain pad 274 and source pad 276 are implemented on an upper surface of the interconnection structure 270. Each of these pads 272, 274, 276 may comprise a respective metal pattern (e.g., a copper pattern). The gate pad 272, drain pad 274 and source pad 276 may have the same or similar sizes and shapes as the respective gate terminal 222, drain terminal 224 and source terminal 226 on the RF amplifier die 210. A plurality of metal filled vias 290 (or alternatively, a solid conductive slug) may be provided underneath the source pad 276 that extend through the interconnection structure 270. The metal-filled vias (or conductive slug) 290 may act as a heat sink that carries heat that is generated in the RF amplifier die 210 and passed to the interconnection structure 270 to the bottom side of the interconnection structure 270 where it is vented into the ambient environment or passed to a heat sink in an underlying structure such as a printed circuit board. As is also shown in FIG. 3, in some embodiments, additional metal-filled vias 290 may be provided under the gate pad 272 and/or under the source pad 276 to provide additional thermal dissipation.

As is further shown in FIG. 3, a plurality of additional components 281 may be mounted on the interconnection structure 270. These components 281 may include, for example, passive RF components such as integrated passive devices or printed circuit boards that include resistors, capacitors and/or inductors. These passive components may form input and/or output matching circuits that are used to (1) match the impedance of the input and/or output of the RF transistor amplifier die 210 to the impedance at the fundamental frequency of the respective input and output RF transmission lines or (2) terminate harmonics of the fundamental frequency that may be present at either the input or output of the RF transistor amplifier die 210. Some of the matching circuitry may also be implemented in the interconnection structure 270. For example, the interconnection structure 270 may include meandered or spiral trace patterns (not shown) that implement inductors that are included in the input and/or output matching circuits. Other RF circuitry may also be mounted on the interconnection structure 270 such as transmit/receive switches, circulators, filters or the like.

Figure 4A:
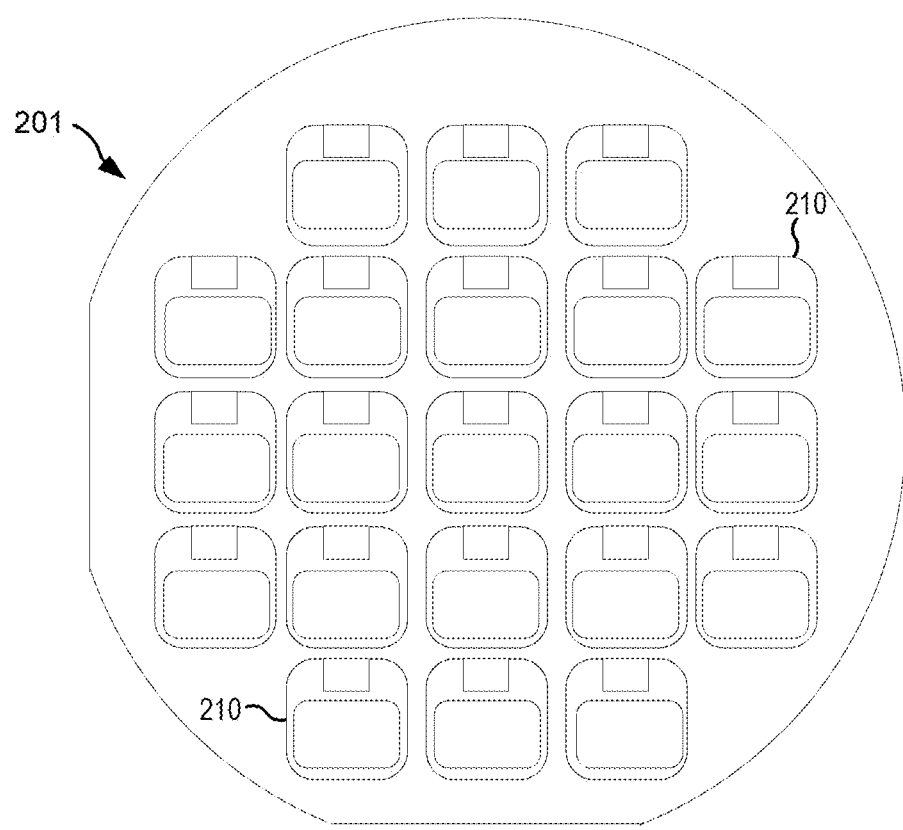
FIG. 4A is a schematic plan view of a wafer having a plurality of RF transistor amplifier dies formed thereon.

One advantage of the having the gate terminal 222, the drain terminal 224 and the source terminal 226 all on the same side of the RF amplifier die 210 is that it may enable more wafer level processing, which may lead to more efficient manufacturing. As shown in FIG. 4A, in many applications, a plurality of RF transistor amplifier dies 210 are fabricated from a single semiconductor wafer 201. The semiconductor wafer 201 may comprise, for example, a silicon carbide wafer, and a plurality of gallium nitride based epitaxial layers may be grown on the silicon carbide wafer 201 using semiconductor epitaxial growth techniques. Then, conventional semiconductor processing techniques such as metal and insulating material deposition, photolithography, masking and/or etching may be performed to form the bottom side and top side metallization structures 220, 240 and the conductive gate vias 262, the conductive drain vias 264 and the conductive source vias 266 in order to form a plurality of RF transistor amplifier dies 210 in the silicon carbide wafer 210 (with a portion of the silicon carbide wafer 201 forming the growth substrate 232 of each individual RF transistor amplifier die 210). Ultimately, the wafer 201 is cut along horizontal and vertical "scribe" lines (not shown) to singulate the individual RF transistor amplifier dies 210. It should be noted that FIG. 4A is an diagram that is provided for illustrative purposes and that typically a much larger number of RF transistor die 210 are formed on a wafer and the RF transistor die 210 are typically located in more dense fashion.

Figure 4B:
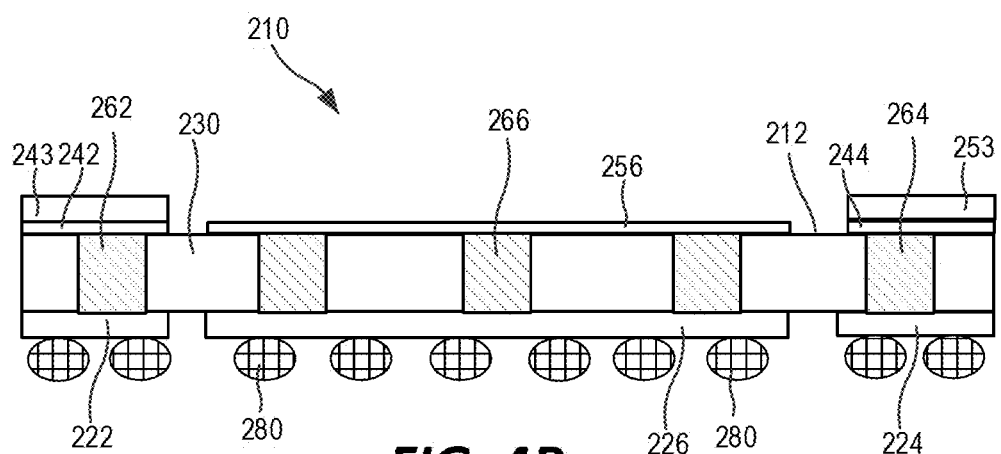
FIG. 4B is a schematic cross-sectional view of an RF transistor amplifier die according to embodiments of the present invention with solder bumps affixed thereto for attachment to an interconnection structure.

FIG. 4B is a schematic cross-sectional view of one of the RF amplifier dies 210 that is included in the wafer 201 of FIG. 4A. As shown in FIG. 4B, contacts 280 (e.g., solder bumps) are affixed to each of the gate terminal 222, the drain terminal 224 and the source terminal 226. These contacts 280 may be used to mechanically and electrically attach the RF transistor amplifier die 210 to an interconnection structure (not shown) such as interconnection structure 270. While not shown in FIGS. 4A and 4B, the contacts 280 may be applied as part of the wafer level processing steps, (i.e., before the semiconductor wafer 201 is diced into a plurality of individual RF transistor amplifier dies 210. Such wafer level processing is faster and more efficient than applying contacts 280 to each individual RF transistor amplifier die 210. Additionally, because the gate terminal 222 and the drain terminal 224 may be electrically connected to corresponding gate and drain pads 272, 274 on the interconnection structure 270 (see FIGS. 2A and 3) in the same processing step that is used to connect the source terminal 226 to the source pad 276 on the interconnection structure 270, all of the electrical connections to the RF transistor amplifier die 210 can potentially be established in a single processing step. In contrast, when conventional RF transistor amplifier die are employed (e.g., RF transistor amplifier die 110 of FIGS. 1A-1B), additional, time consuming wire bonding processes are employed to make the electrical connections to the gate and drain terminals 142, 144. Eliminating these processing steps may significantly simplify the manufacturing process.

As described above, provision of the conductive gate vias 262 and the conductive drain vias 264 results in all three of the gate, drain and source terminals 222, 224, 226 for the RF transistor amplifier die 210 being on the same surface of the die, and hence in the same plane. This makes it possible to employ a variety of different types of wafer level packaging techniques such as, for example, various fan-in, fan-out and interposer topologies. The RF transistor amplifier dies according to embodiments of the present invention may be mounted directly on interconnection structures or on intervening structures such as RDL laminate structures or interposers (which may be a custom RDL laminate structure) using contacts such as, for example, conductive bumps or conductive die attach materials. When the RF transistor amplifier dies according to embodiments of the present invention are mounted on, for example, RDL laminate structures or interposers, contacts may be pre-mounted on the bottom surfaces of the RDL laminate structures/interposers which may allow end users to readily mount the RF amplifier dies on or other structures. Moreover, as noted above, the provision of the conductive gate vias 262 and the conductive drain vias 264 reduces the variation in the electrical path lengths, which improves performance, and may reduce or eliminate the need for costly and time-consuming wire bonding processes. The reduced or eliminated need for wire bonds may also allow for reduced die size in some applications (where the sizes of the wire bond pads drive die size), and hence the RF transistor amplifier dies according to embodiments of the present invention may also exhibit increased integration density. Thus, the RF amplifier die according to embodiments of the present invention may exhibit improved product assembly consistency, higher yields, increased product integration, reduced cost and improved RF performance, especially for products operating at high frequencies such as millimeter wave frequencies.

The techniques disclosed herein may be particularly beneficial in higher frequency applications as the inductance required in the matching circuits may be much lower in such applications, and hence the use of traditional bond wires may inject too much inductance. Additionally, the tolerances in the bond wire lengths may have a larger impact at higher frequencies, and in high frequency applications (particularly if lower power) the size of the bond pads may drive the size of the die. In some embodiments, any of the RF transistor amplifier dies disclosed herein may be configured to operate at frequencies greater than 1 GHz. In other embodiments, these RF transistor amplifier dies may be configured to operate at frequencies greater than 2.5 GHz. In still other embodiments, these RF transistor amplifier dies may be configured to operate at frequencies greater than 3.1 GHz. In yet additional embodiments, these RF transistor amplifier dies may be configured to operate at frequencies greater than 5 GHz. In some embodiments, these RF transistor amplifier dies may be configured to operate in at least one of the 2.5-2.7 GHz, 3.4-4.2 GHz or 5.1-5.8 GHz frequency bands or sub-portions thereof.

Figure 4C:
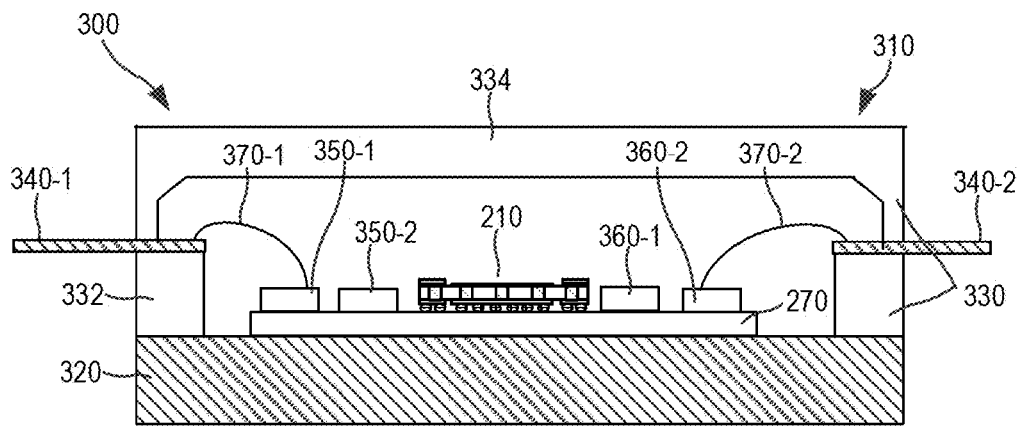
FIG. 4C is a schematic cross-sectional view of a packaged RF transistor amplifier that includes the RF transistor amplifier die of FIG. 4B in a ceramic package.
Figure 4D:
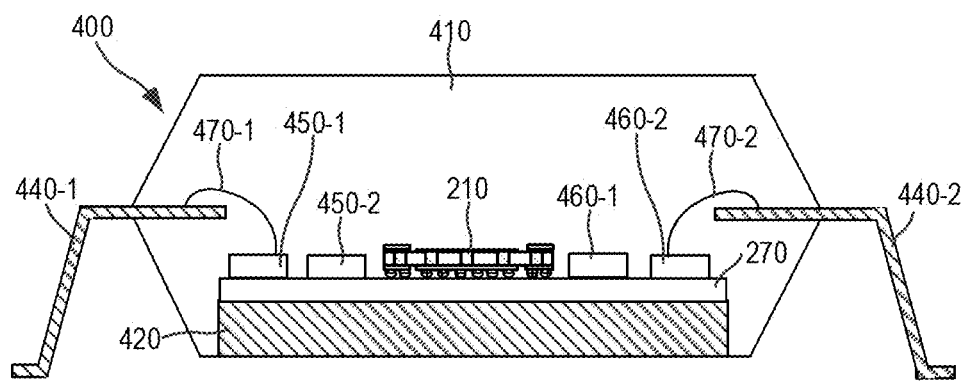
FIG. 4D is a schematic cross-sectional view of a packaged RF transistor amplifier that includes the RF transistor amplifier die of FIG. 4B in an overmold plastic package.
Figure 4E:
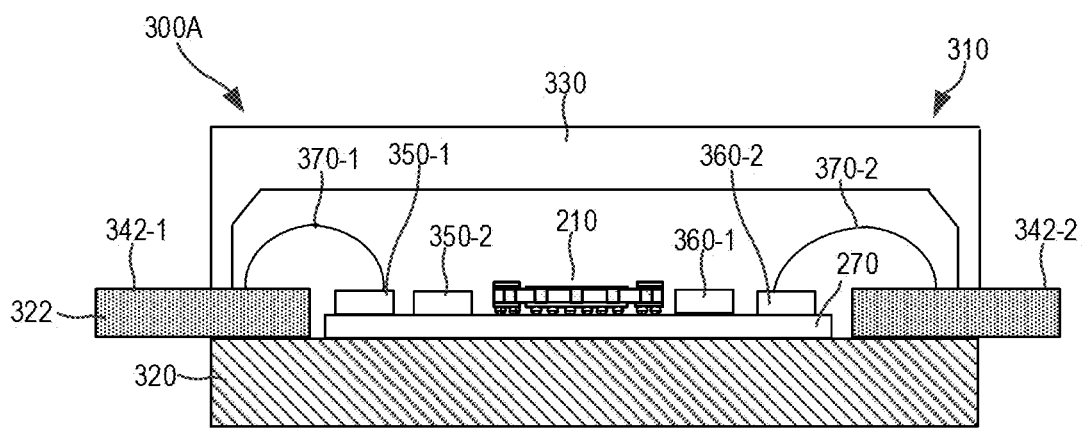
FIG. 4E is a schematic cross-sectional view of a packaged RF transistor amplifier that includes the RF transistor amplifier die of FIG. 4B in a printed circuit board based package.
Figure 5B:
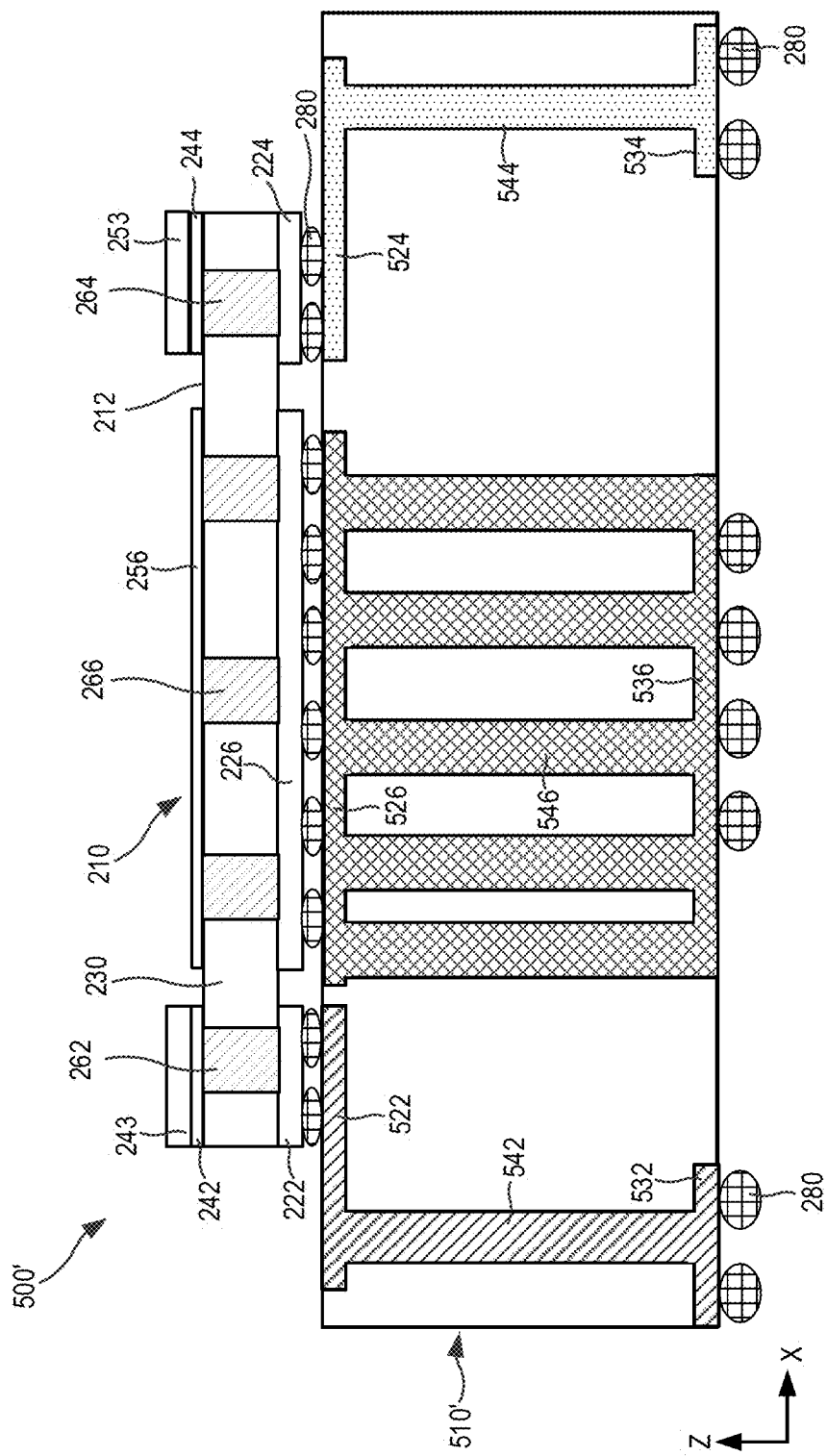
FIG. 5B is a schematic cross-sectional view of an RF transistor amplifier die according to embodiments of the present invention that is mounted on a redistribution layer substrate in a fan-out topology.
Figure 5C:
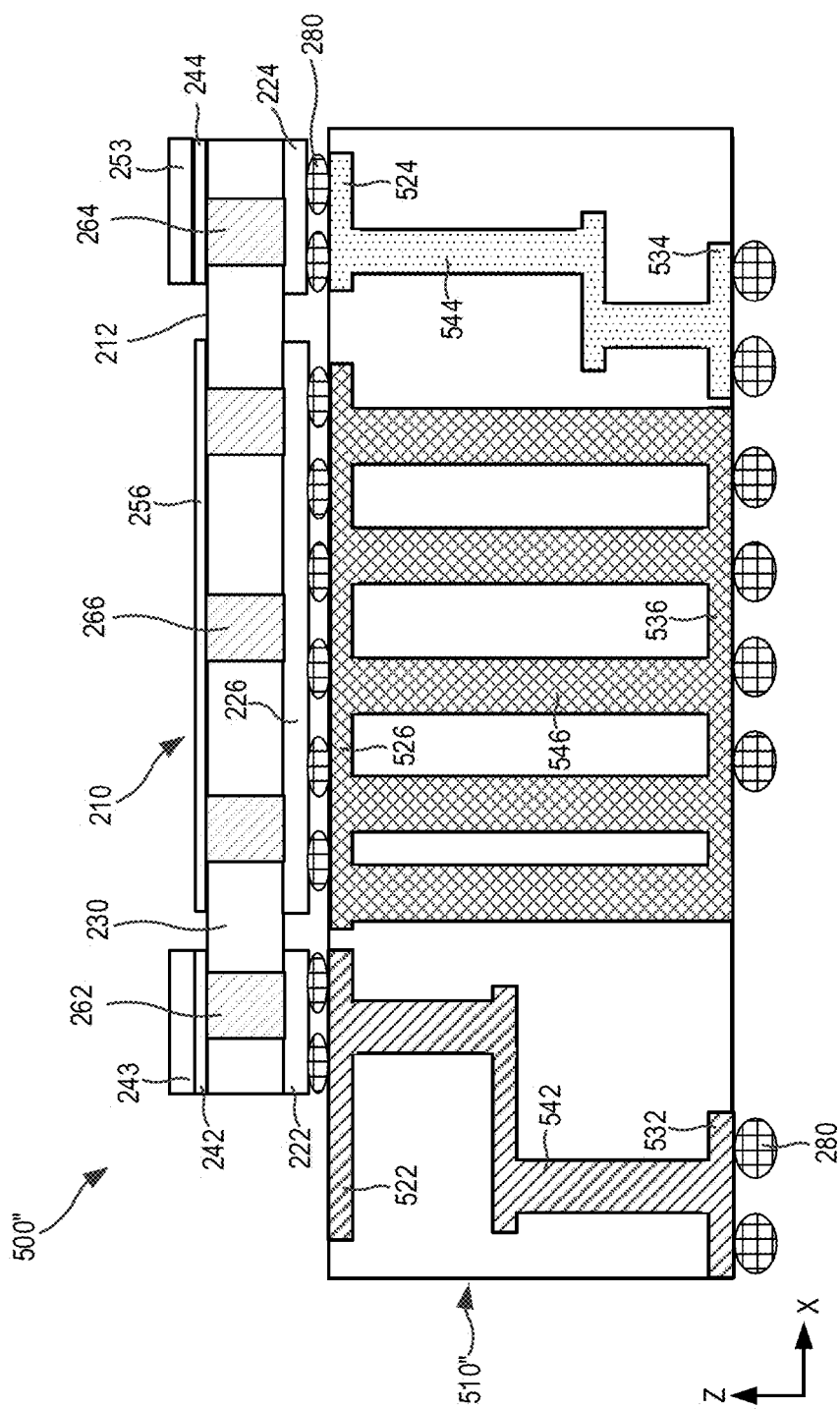
FIG. 5C is a schematic cross-sectional view of an RF transistor amplifier die according to embodiments of the present invention that is mounted on a custom interposer in a fan-out topology.

FIGS. 4C through 4E illustrate example packaged RF transistor amplifiers that each include RF transistor amplifier dies according to embodiments of the present invention. FIGS. 5A-5C then illustrate how the planarized terminal configuration of the RF transistor amplifier dies according to embodiments of the present invention also allow the RF transistor amplifier dies to be used in a variety of different wafer level packaging topologies.

FIG. 4C is a schematic cross-sectional view of a packaged RF transistor amplifier 300 that includes the RF transistor amplifier die 210 of FIG. 4B in an open cavity package. As shown in FIG. 4C, the open-cavity package 310 includes a base 320, such as a metal flange, and an upper housing 330 which may include, for example, sidewalls 332 and a lid 334. In an example embodiment, the base 320 may be a multilayer copper/molybdenum/copper metal flange that comprises a core molybdenum layer with copper cladding layers on either major surface thereof. The ceramic sidewalls 332 and lid 334 may be formed of, for example, $Al_2O_3$. The ceramic lid 334 may be glued to the ceramic sidewalls 332 using an epoxy glue. The ceramic sidewalls 332 may be attached to the metal base 320 via braising. The RF transistor amplifier die 210 may, for example, be mounted on an interconnection structure 270 using, for example, the conductive contacts, such as bumps 280, shown in FIG. 4B, and the interconnection structure 270 is mounted on the base 320 using, for example, a conductive die attach material. The base 320 may dissipate heat carried through the heat dissipation structures 290 in interconnection structure 270 outside of ceramic package 310.

Additional components 350, 360 are mounted on the interconnection structure 270. These additional components may include, for example, input matching components 350 and output matching components 360 that are used to impedance match at the fundamental frequency and/or to terminate intermodulation products to ground. As discussed above, these matching components 350, 360 may be passive RF components that include resistors, capacitors and/or inductors that are implemented (at least partially) in integrated passive devices or printed circuit boards, for example. Conductive leads 340 extend through the housing 310 to allow the RF transistor amplifier 300 to be connected to external devices/circuits/power sources. In the depicted embodiment, wire bonds 370 are used to connect the conductive leads 340 to passive RF components 350, 360 on the interconnection structure 270. It will be appreciated, however, that the wire bonds 370 may be omitted in other embodiments and different electrical connections ay be used. An RF signal input to the RF transistor amplifier 300 on a first lead 340-1 may be passed through the wire bond 370-1 to input matching circuits 350 and from there to a gate terminal 222 (see FIG. 4B) of the RF transistor amplifier die 210, and the amplified output RF signal may be passed from the drain terminal 224 of the RF transistor amplifier die 210 to the output matching circuits 360 and from there to the bond wire 370-2 where the RF signal is output through lead 340-2.

FIG. 4D is a schematic cross-sectional view of a packaged RF transistor amplifier 400 that includes the RF transistor amplifier die 210 of FIG. 4B in an overmold plastic package. As shown in FIG. 4D, the packaged RF transistor amplifier 400 includes a base 420, such as a metal heat sink that is part of a lead frame or metal slug, that is at least partially surrounded by a plastic overmold 410. The RF transistor amplifier die 210 is mounted on an interconnection structure 270 using, for example, the conductive bumps 280 shown in FIG. 4B, and the interconnection structure 270 is mounted on the base 420. The base 420 may comprise, for example, a metal base that may dissipate heat carried through the heat dissipation structures 290 in interconnection structure 270. Additional components 450, 460 are mounted on the interconnection structure 270. These additional components may include, for example, input matching components 450 and output matching components 460 that are used to impedance match at the fundamental frequency and/or to terminate intermodulation products to ground. As discussed above, these matching components may be passive RF components that include resistors, capacitors and/or inductors that are implemented (at least partially) in integrated passive devices or printed circuit boards, for example. Conductive leads 440 extend through the plastic overmold 410 to allow the RF transistor amplifier 400 to be connected to external devices/circuits/power sources. In the depicted embodiment, wire bonds 470 are used to connect the conductive leads 440 to the passive RF components 450, 460 on the interconnection structure 270, although the wire bonds 470 may be omitted in other embodiments.

FIG. 4E is a schematic cross-sectional view of a packaged RF transistor amplifier 300A that includes the RF transistor amplifier die of FIG. 4B in a printed circuit board based package. The packaged RF transistor amplifier 300A is very similar to the packaged RF transistor amplifier 300 discussed above with reference to FIG. 4C, except that the leads 340-1, 340-2 of packaged RF transistor amplifier 300 are replaced with a printed circuit board 322 that includes traces 342-1, 342-2 that act as the input and output leads. The printed circuit board 322 may be attached to the metal base 320 via, for example, a conductive glue. The printed circuit board 322 includes a central opening and the interconnection structure 270 is mounted within this opening on the base (e.g., metal flange) 320. The RF transistor die 210 and the matching networks 350-1, 350-2, 360-1, 360-2 are mounted on the interconnection structure 270.

It will be appreciated that any of the RF transistor amplifiers according to embodiments of the present invention that are discussed herein may be mounted in packages such as the open cavity and overmold packages shown in FIGS. 4C through 4E. Thus, the RF transistor die 210 and interconnection structures 270 shown in FIGS. 4C-4E may be replaced with the RF transistor die and interconnection structures according to any of the embodiments of the present invention that are discussed herein to provide many further embodiments of packaged RF transistor amplifiers. Depending on the embodiment, the packaged RF transistor amplifier can include a monolithic microwave integrated circuit (MMIC) as the RF transistor amplifier die where the RF transistor amplifier die incorporates multiple discrete circuits in a single integrated die. Additionally and/or alternatively, the package can comprise multiple RF transistor amplifier die in a path that are connected in series to form a multiple stage RF transistor amplifier and/or multiple RF transistor amplifier die that are disposed in multiple paths (e.g., in parallel) to form an RF transistor amplifier with multiple transistor amplifier die and multiple paths, such as in a Doherty amplifier configuration. In some embodiments, the packaged RF transistor amplifier may include RF transistor amplifier die according to embodiments of the present invention that have conducive gate vias and/or conductive drain vias that provide electrical connections to a back side interconnection structure as well as traditional RF transistor amplifier die such as the RF transistor die 110 of FIG. 1A that have gate and drain terminals that are connected to other structures via wire bonds.

FIG. 5A is a schematic cross-sectional view of an RF transistor amplifier 500 according to embodiments of the present invention that includes the RF transistor amplifier die 210 mounted on a RDL laminate structure 510 in a fan-in topology. As is known in the art, integrated circuit chips may be mounted on and electrically connected to various underlying substrates using contacts such as conductive bumps or other conductive attachment mechanisms. The contacts may provide electrical connections between terminals on the integrated circuit chip and corresponding electrical connection points (e.g., conductive pads) on the substrate. The substrate may be used to rearrange the configuration of the gate, drain and source terminals to, for example, align with terminals on another substrate.

As shown in FIG. 5A, the RF transistor amplifier die 210 may be mounted on an RDL laminate structure 510. The RDL laminae structure 510 may include an upper gate terminal 522, an upper drain terminal 524 and an upper source terminal 526 that may be aligned with the respective gate terminal 222, drain terminal 224 and source terminal 226 on RF transistor amplifier die 210 so that the gate terminal 222, drain terminal 224 and source terminal 226 may be physically and electrically connected to the respective upper gate terminal 522, upper drain terminal 524 and upper source terminal 526 using, for example, conductive epoxies or bumps (not shown). The RDL laminate structure 510 further includes a lower gate terminal 532 a lower drain terminal 534 and a lower source terminal 536. As shown in FIG. 5A, one or more conductive gate vias 542, conductive drain vias 544 and conductive source vias 546 are provided that electrically connect the upper gate terminal 522 to the lower gate terminal 532, the upper drain terminal 524 to the lower drain terminal 534, and the upper source terminal 526 to the lower source terminal 536. The conductive gate vias 542 and the conductive drain vias 544 are located inwardly on the bottom surface of the RF transistor amplifier die 210 of the respective gate terminal 222 and drain terminal 224. Conductive bumps 280 are attached to the lower gate terminal 532 the lower drain terminal 534 and the lower source terminal 536 for attaching the RF transistor amplifier 500 to another substrate, such as a customer printed circuit board. The RF transistor amplifier 500 has a fan-in topology where the RDL laminate structure 510 relocates the electrical connections for the gate, drain and source (here conductive bumps 280) generally inwardly towards the center of the bottom surface of the RF transistor amplifier die 210.

Since the conductive bumps 280 are all within the "footprint" of the RF transistor amplifier die 210, the conductive bumps 280 may be applied during wafer level processing to the bottom side of the wafer 201 shown in FIG. 4A, and the wafer 201 may then be diced after the conductive bumps 280 have been applied into individual RF transistor amplifier die 210. Typically, the individual RF transistor amplifier die 210 are mounted on a large RDL laminate structure (or other interconnection structure), which is later diced to provide a plurality of the RF transistor amplifiers 500 of FIG. 5A. It will be appreciated, however, that in other embodiments an RDL laminate structure could be bonded to the wafer 201 and the wafer 201 could thereafter be diced to provide a plurality of the RF transistor amplifiers 500 of FIG. 5A.

FIG. 5B is a schematic cross-sectional view of an RF transistor amplifier 500' according to embodiments of the present invention that includes the RF transistor amplifier die 210 mounted on a redistribution layer substrate 510' in a fan-out topology. The RF transistor amplifier 500' is very similar to the RF transistor amplifier 500 discussed above, except that the RDL laminate structure 510' included therein has a fan-out topology in which the lower gate terminal 532 and the lower drain terminal 534 are located outwardly (when the RF transistor amplifier die 210 is viewed from below) of the respective gate terminal 222 and drain terminal 224. Conductive bumps (or other contacts) 280 are attached to the lower gate terminal 532 the lower drain terminal 534 and the lower source terminal 536 for attaching the RF transistor amplifier 500' to another substrate, such as a customer printed circuit board.

FIG. 5C is a schematic cross-sectional view of an RF transistor amplifier 500" according to embodiments of the present invention that includes an RF transistor amplifier die 210 that is mounted on a custom interposer 510" in a fan-out topology. Interposers may be custom RDL laminate structure designs that allow increased flexibility with respect to the location of the contacts 280. Additionally, in some cases passive circuits such as capacitors or inductors (not shown) may be implemented within the interposer 510", reducing the need for additional components 280 (see FIG. 3).

As discussed above, Group III nitride-based RF transistor amplifiers often include one or more of an input impedance matching network, an input harmonic termination circuit, an output harmonic termination circuit, and an output impedance matching network. Each of these matching circuits may include one or more capacitors and/or inductors. In conventional RF transistor amplifiers, the inductances are often at least partly implemented using bond wires that form connections between the RF transistor amplifier die, various passive RF components and input/output leads of the amplifier.

As applications move to higher frequencies, the amount of inductance needed to properly impedance match at the fundamental frequency and/or to terminate certain harmonics such as the second and/or third order harmonics typically decreases. In some applications, even if very short, thick bond wires are used, the inductance of the bond wires may exceed the optimum amount of inductance required by one or more of the matching circuits. If the inductance is larger than the optimum amount of inductance for an impedance matching circuit, then the return loss of the RF transistor amplifier may be increased, and/or the operating bandwidth may be reduced. If the inductance is larger than the optimum amount of inductance for a harmonic termination circuit, then less reduction in the harmonic at issue may be achieved, which may degrade the efficiency, power and/or gain performance of the RF transistor amplifier, and result in increased levels of passive intermodulation distortion that may degrade other aspects of a communication system in which the RF transistor amplifier is used.

The Group III nitride-based RF transistor amplifiers according to embodiments of the present invention may avoid the above-discussed problem of having more series inductance than the amount of series inductance that provides for optimum impedance matching. In particular, the conductive gate and drain vias that are used in the RF transistor amplifiers according to embodiments of the present invention may have lengths of less than 8 mils, and often less than 5 mils, less than 4 mils or even less than 3 mils in example embodiments. In contrast, the gate and drain bond wires that are used in the conventional RF transistor amplifiers typically are at least 20 mils in length, with lengths of 35 mils or more being common. As such, the inductance injected by the gate and drain vias may be a small fraction of the inductance injected by comparable gate and drain bond wires (e.g., perhaps on the order of 15-20% the inductance), which may ensure that the inductance is less than or equal to the optimum amount of inductance required by the various matching circuits of the Group III nitride-based RF transistor amplifier. Any additional inductance required to obtain the optimum amount of inductances for the matching networks may be added using inductor chips and/or inductive traces (or other structures) that are mounted on or implemented in the interconnection structure, in RF passive components or the like.

Mounting the gate and drain terminals on the bottom side of the device may also reduce process variation during high volume manufacturing, as the ball bonders that are used to solder the bond wires to the gate and drain terminals on RF transistor amplifier die typically have a tolerance of +/−1 mil, resulting in potentially as much as 4 mils of variation in the length of each bond wire. The amount of inductance associated with such variation in the lengths of the bond wires can be significant, particularly at higher frequencies, and can degrade the performance of the impedance matching circuits, and hence the performance of the RF transistor amplifier. Additionally, connecting the gate and drain terminals to corresponding gate and drain pads on the interconnection structure through a surface mount process using conductive bumps, die attach material or the like may allow for the use of smaller gate and drain terminals than could be used when bond wire connections are required, and hence the RF transistor amplifier dies according to embodiments of the present invention may be smaller in applications where the gate and drain terminal sizes impacted the size of the die. Additionally, using ball bonding techniques as opposed to wire bonds may reduce manufacturing costs.

Figure 6:
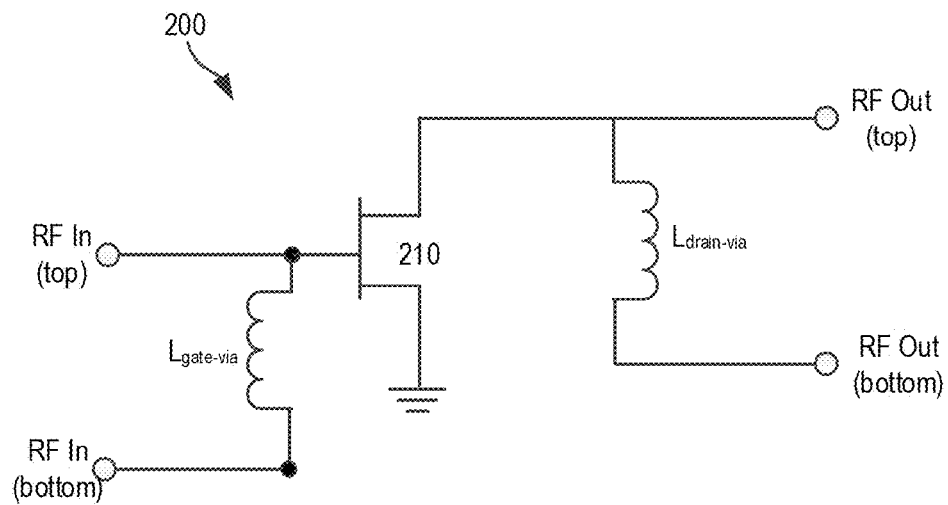
FIG. 6 is a circuit diagram of an RF transistor amplifier die according to embodiments of the present invention that illustrates how multiple connection points are available for both the gate and the drain connections which may offer increased flexibility for connecting impedance matching and/or harmonic termination circuits to the RF transistor amplifier die.

Another advantage provided by the conductive gate and drain vias that are included in the RF transistor amplifiers according to embodiments of the present invention is that more flexibility is provided for implementing the matching networks, since connections may be made to both the tops and bottoms of the conductive gate and drain vias. This feature of the RF transistor amplifiers according to embodiments of the present invention is schematically shown in the circuit diagram of FIG. 6. As shown in FIG. 6, the RF transistor amplifier 200 has a pair of RF inputs, namely a first "top" RF input that connects directly to the gate (i.e., an upper gate terminal that connects directly to the gate bus) of the RF transistor amplifier die 210, and a "bottom" RF input that connects to the bottom of the conductive gate vias 262. These RF inputs are electrically connected to each other through an inductance Lgate-via which represents the inherent inductance of the conductive gate vias 262. Likewise, the RF transistor amplifier 200 has a pair of RF outputs, namely a first "top" RF output that connects directly to the drain (i.e., an upper drain terminal that connects directly to the drain bus) of the RF transistor amplifier die 210, and a "bottom" RF output that connects to the bottom of the conductive drain vias 264. These RF outputs are electrically connected to each other through an inductance $L_{drain-via}$ which represents the inherent inductance of the conductive drain vias 264. This arrangement may provide increased flexibility to implement certain matching topologies.

Figure 7A:
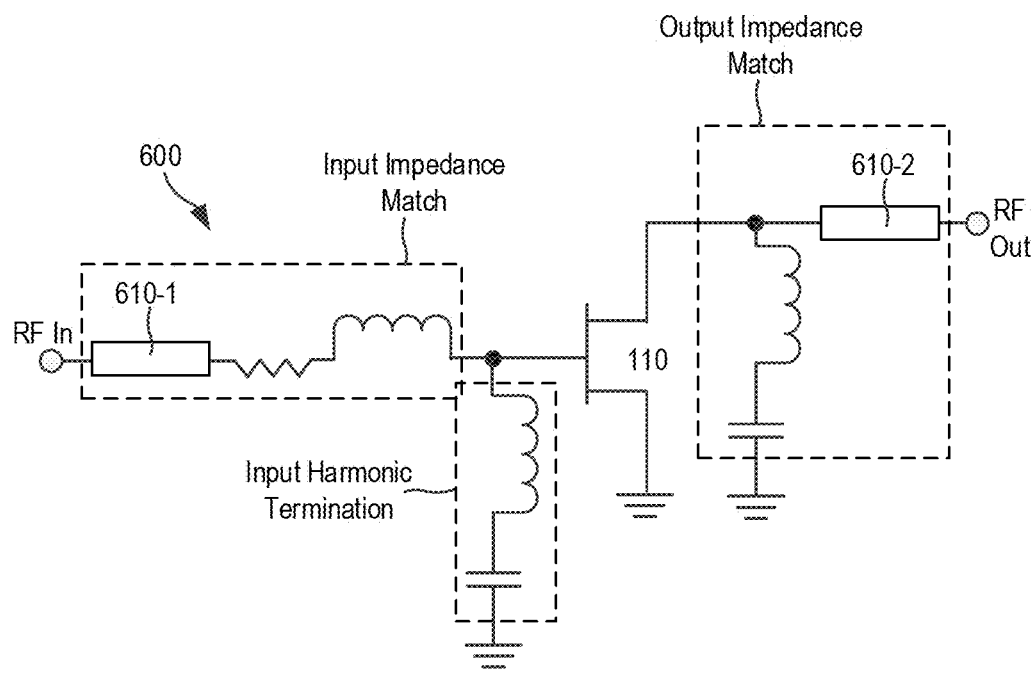
FIG. 7A is a circuit diagram of a conventional packaged RF transistor amplifier.

For example, FIG. 7A is a circuit diagram of a conventional RF transistor amplifier 600 that has an input series impedance matching circuit, an input harmonic termination circuit for termination of the harmonic frequencies (e.g., second harmonics or "2f0"), and an output shunt-L impedance matching circuit. The input and output series transmission lines 610-1, 610-2 may be selected to provide appropriate impedance transformation between the RF transistor amplifier die 110 and the RF input (e.g., a gate lead) and output (e.g., a drain lead). These series transmission lines 610-1, 610-2 can be treated as an extension of the transmission line matching network on an underlying substrate (not shown) such as, for example, a customer printed circuit board, and electrical widths can be selected or configured to achieve the desired characteristic impedance for the impedance matching. In conventional designs, these matching circuits are implemented through bond wires (for the inductances) and RF passive components (for the capacitances). This arrangement may result in parasitic coupling between the input and output side bond wires that can compromise RF performance and, as described above, at higher frequencies the bond wires may inject too much inductance which can compromise the impedance match and/or the harmonic termination.

Figure 7B:
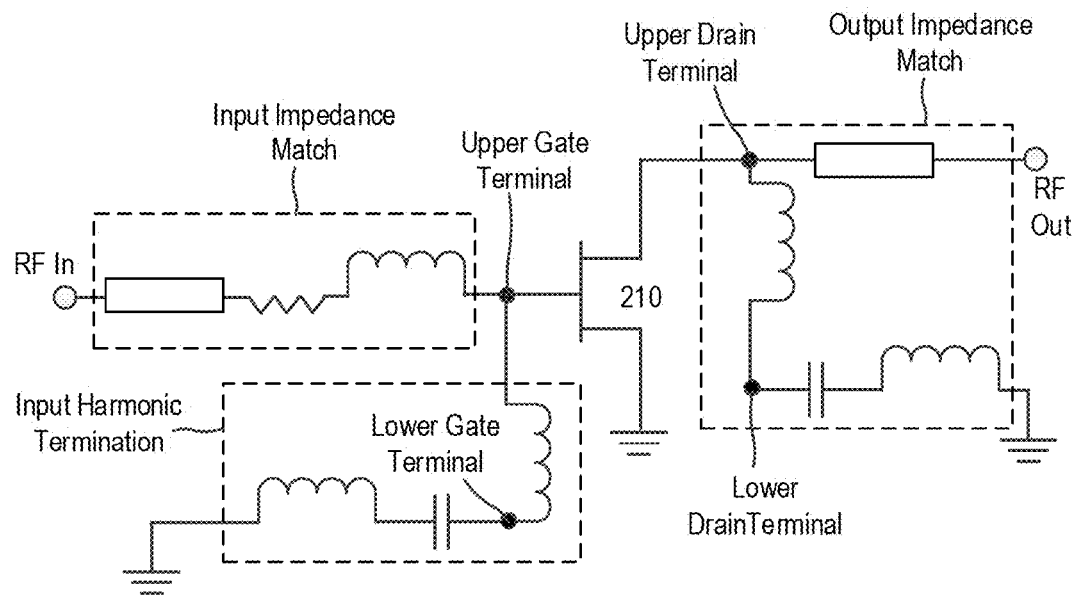
FIG. 7B is a circuit diagram of a packaged RF transistor amplifier according to embodiments of the present invention.
Figure 7C:
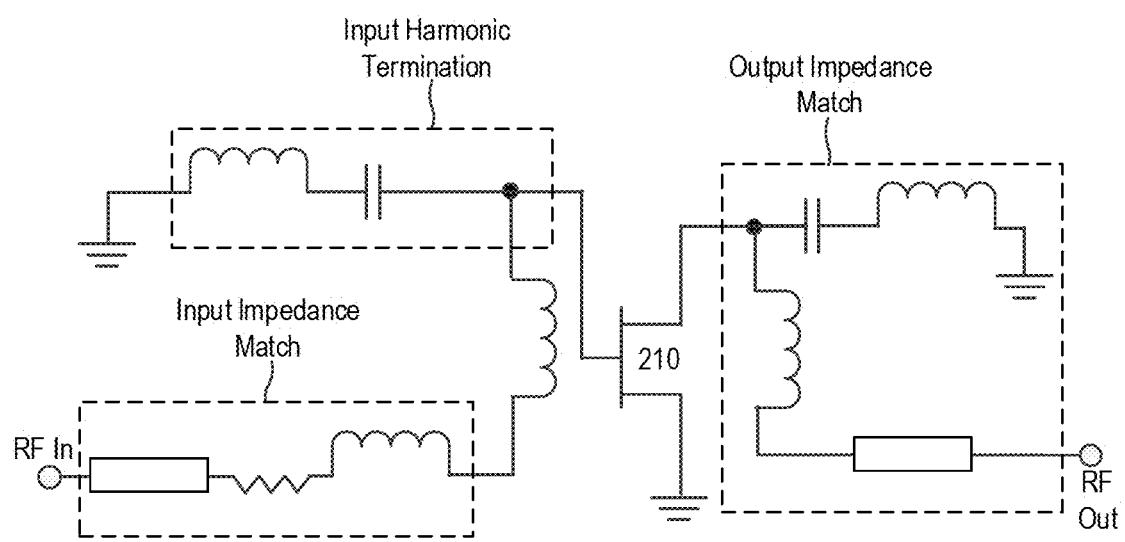
FIG. 7C is a circuit diagram of a packaged RF transistor amplifier according to further embodiments of the present invention.

FIGS. 7B and 7C illustrate two possible implementations of the matching topology shown in FIG. 7A using RF transistor amplifier die according to embodiments of the present invention. As shown in FIG. 7B, the RF input and the input impedance matching network are connected to the upper gate terminal, while the input harmonic termination circuit may be coupled to the lower gate terminal. On the output side, the output impedance matching network is connected to the lower drain terminal as a shunt circuit, while the RF output is connected to the upper drain terminal. As shown in FIG. 7C, in an alternative embodiment, the RF input and the input impedance matching network are connected to the lower gate terminal, while the input harmonic termination circuit may be coupled to the upper gate terminal as a shunt circuit. On the output side, the output impedance matching network is connected to the upper drain terminal as a shunt circuit, while the RF output is connected to the lower drain terminal.

Figure 8A:
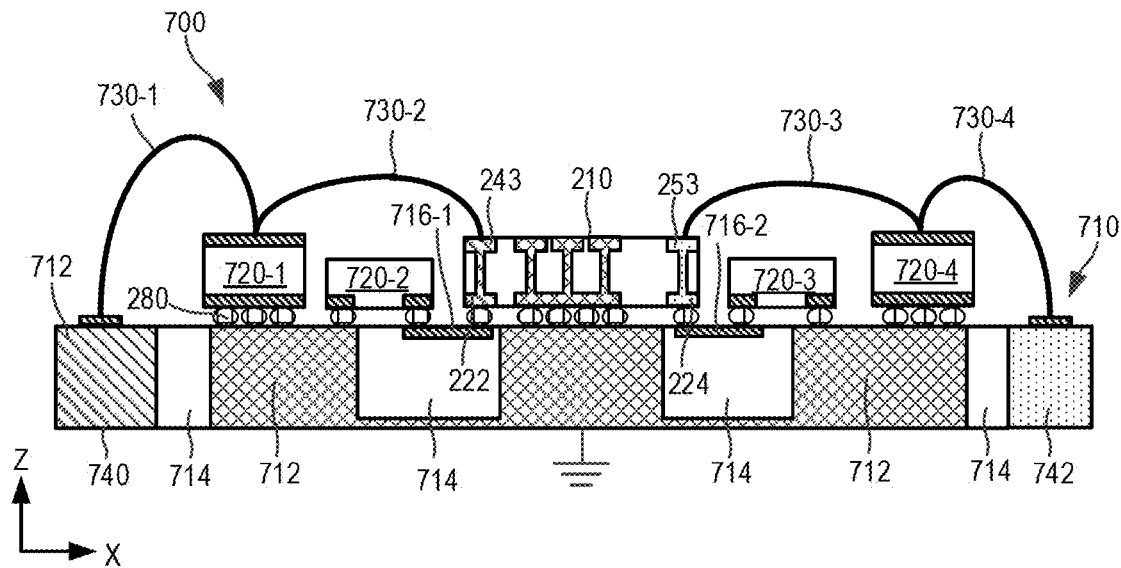
FIG. 8A is a schematic cross-sectional view of an RF transistor amplifier according to further embodiments of the present invention.
Figure 8B:
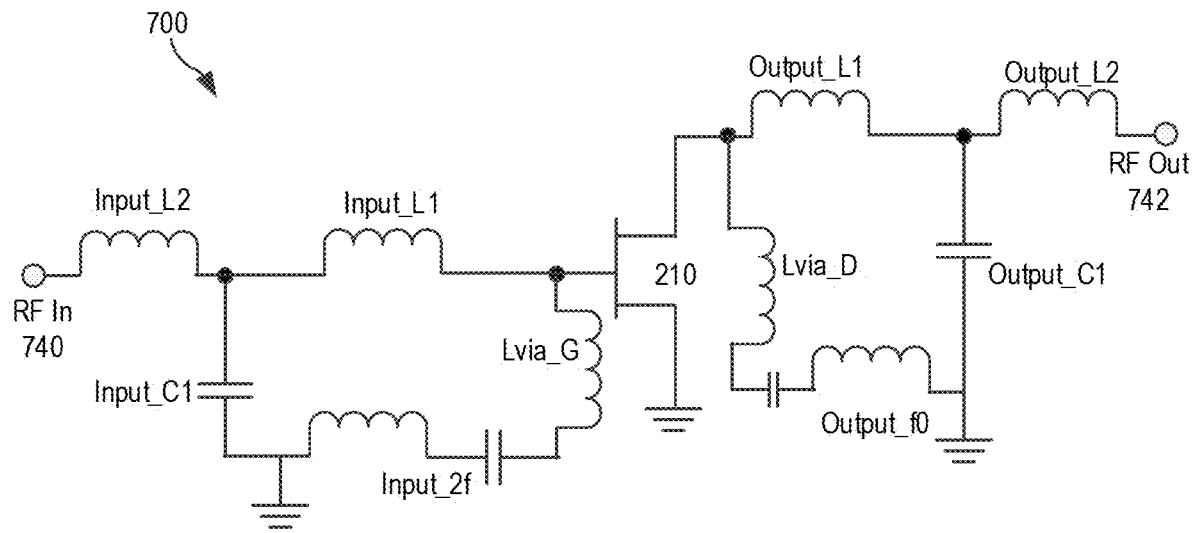
FIG. 8B is a circuit diagram of the RF transistor amplifier of FIG. 8A.

FIGS. 8A and 8B illustrate an RF transistor amplifier 700 according to further embodiments of the present invention. In particular, FIG. 8A is a schematic cross-sectional view of the RF transistor amplifier 700 that illustrates the circuits components included therein and the electrical interconnections therebetween, while FIG. 8B is a circuit diagram of the RF transistor amplifier 700.

As shown in FIG. 8A, the RF transistor amplifier 700 includes an RF transistor die, which may be implemented, for example, using the RF transistor amplifier die 210 that is described above, or any of the other RF transistor amplifier die according to embodiments of the present invention. The RF transistor amplifier die 210 is mounted on an RDL laminate structure 710, although other mounting structures may be used in other embodiments such as multi-layer printed circuit boards or integrated passive devices or "IPDs" that comprise capacitors (and perhaps other passive devices such as inductors) formed on thin film substrates such as silicon, alumina, or glass using semiconductor processing techniques. The RDL laminate structure 710 includes conductive regions 712 and dielectric regions 714. A plurality of RF passive components 720-1 through 720-4 are mounted on the RDL laminate structure 710. Interconnections amongst and between the RF transistor amplifier die 210 and the RF passive components 720-1 through 720-4 are made using bond wires 730 and through electrical connections in the RDL laminate structure 710.

In particular, the RF input 740 and the RF output 742 are formed as conductive structures in the RDL laminate structure 710. The RF input 740 may be connected to a first external circuit and the RF output 742 may be connected to a second external circuit. Focusing first on the input (left) side of FIG. 8A, a first bond wire 730-1 connects the RF input 740 to an upper terminal of an RF passive component 720-1 that comprises a shunt capacitor to ground. The RF passive component 720-1 may be implemented as, for example, a capacitor IPD or a surface mount capacitor chip. A lower terminal of RF passive component 720-1 is connected to a grounded region in the RDL laminate structure 710. The first bond wire 730-1 implements the inductance "Input_L2" shown in FIG. 8B, and the RF passive component 720-1 implements the shunt capacitance "Input_C1" shown in FIG. 8B. A second bond wire 730-2 connects the upper terminal of RF passive component 720-1 to the upper gate terminal 243 of RF transistor amplifier die 210. The second bond wire 730-2 implements the series inductance "Input_L1" shown in FIG. 8B. The inherent inductance of the conductive gate vias 262 in RF transistor amplifier die 210 is shown in FIG. 8B as the inductance "Lvia_G." The lower gate terminal 222 of RF transistor amplifier die 210, which is connected to the lower ends of the conductive gate vias 262, is connected via a contact 280 to a conductive trace 716-1 on RDL laminate structure 710. Conductive trace 716-1 is connected to RF passive component 720-2, which may include capacitors and/or inductors. RF passive component 720-2 may be implemented, for example, as an IPD or as a surface mount chip. The combination of conductive trace 716-1 and RF passive component 720-2 may implement the series C-L circuit "Input_2f" shown in FIG. 8B.

Focusing next on the output (right) side of FIG. 8A, a third bond wire 730-3 connects the upper drain terminal 253 of RF transistor amplifier die 210 to an upper terminal of RF passive component 720-4, which forms a shunt capacitor to ground. RF passive component 720-4 may be implemented as, for example, a capacitor IPD or as a surface mount capacitor chip. A lower terminal of RF passive component 720-4 is connected to a grounded region in the RDL laminate structure 710 via contacts 280. The third bond wire 730-3 implements the series inductance "Output_L1" shown in FIG. 8B, and the RF passive component 720-4 implements the shunt capacitance "Output_C1" shown in FIG. 8B. A fourth bond wire 730-4 connects the upper terminal of RF passive component 720-4 to the RF output 742 in the RDL laminate structure 710. The fourth bond wire 730-4 implements the series inductance "Output_L2" shown in FIG. 8B. The inherent inductance of the conductive drain vias 264 in RF transistor amplifier die 210 is shown in FIG. 8B as the inductance "Lvia_D." The lower drain terminal 224 of RF transistor amplifier die 210, which is connected to the lower ends of the conductive drain vias 264, is connected via a contact 280 to a conductive trace 716-2 on RDL laminate structure 710. Conductive trace 716-2 is connected to RF passive component 720-3, which may include capacitors and/or inductors. RF passive component 720-3 may be implemented, for example, as IPD or a surface mount chip. The combination of conductive trace 716-2 and RF passive component 720-3 may implement the series C-L circuit "Output_f0" shown in FIG. 8B.

Figure 9A:
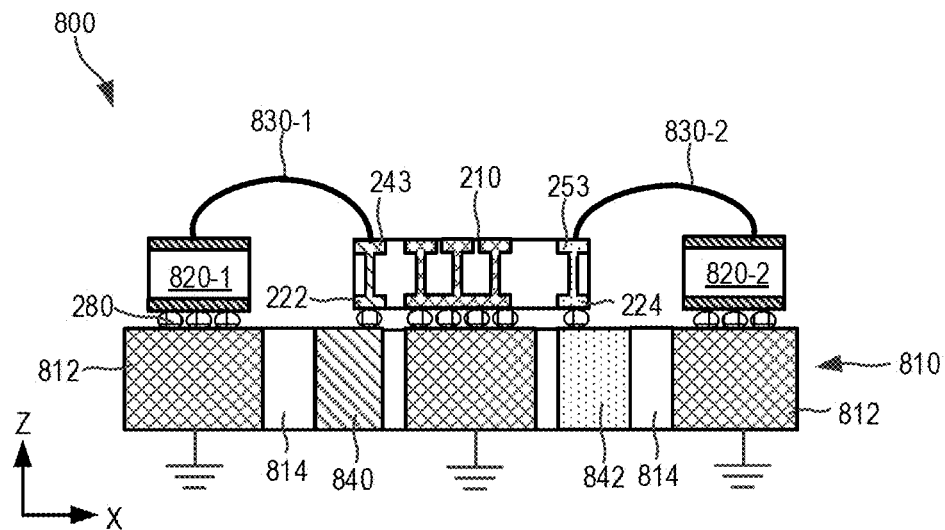
FIG. 9A is a schematic cross-sectional view of an RF transistor amplifier according to still further embodiments of the present invention.
Figure 9B:
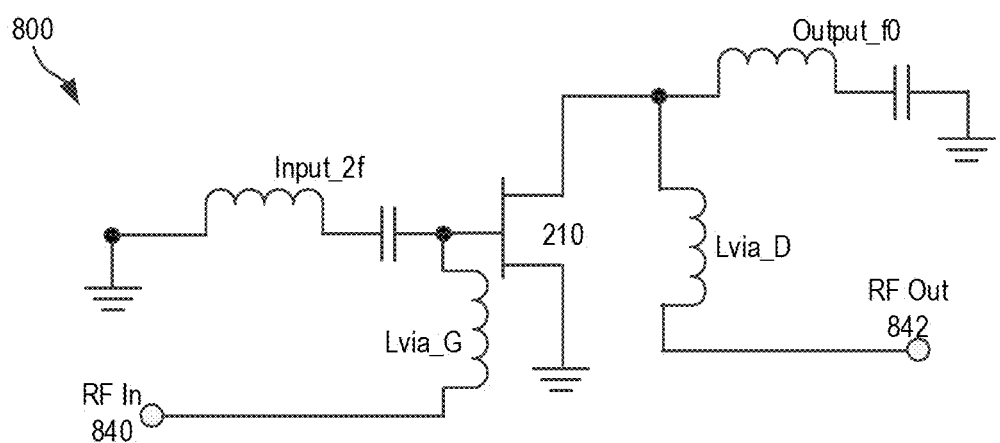
FIG. 9B is a circuit diagram of the RF transistor amplifier of FIG. 9A.

As can be seen from FIGS. 8A-8B, in the RF transistor amplifier 700, the RF input and RF output are routed through the upper gate and drain terminals, respectively, and the input harmonic termination circuit and the output impedance matching circuit are routed through the lower gate and drain terminals, respectively. FIGS. 9A and 9B are a schematic cross-sectional view and a circuit diagram, respectively, of an RF transistor amplifier 800 in which the RF input and RF output are routed through the lower gate and drain terminals, respectively, and the input harmonic termination circuit and the output impedance matching circuit are routed through the respective upper gate and drain terminals.

As shown in FIG. 9A, the RF transistor amplifier 800 includes an RF transistor amplifier die 210 (which may be implemented as any of the other RF transistor amplifier die according to embodiments of the present invention) that is mounted on an RDL laminate structure 810 (which may alternatively be another mounting structure such as a multi-layer printed circuit boards or IPD). The RDL laminate structure 810 includes conductive regions 812 and dielectric regions 814. A pair of RF passive components 820-1, 820-2 are mounted on the RDL laminate structure 810. An RF input 840 is implemented as a conductive structure in the RDL laminate structure 810. This RF input 840 may be connected to a first external circuit. The RF input 840 is connected by a contact 280 to the lower gate terminal 222 of RF transistor amplifier die 210, and is connected to the gate of RF transistor amplifier die 210 through the conductive gate vias 262. The inherent inductance of the conductive gate vias 262 in RF transistor amplifier die 210 is shown in FIG. 9B as the inductance "Lvia_G." A first bond wire 830-1 connects the upper gate terminal 243 of RF transistor amplifier die 210 to an upper terminal of RF passive component 820-1. RF passive component 820-1 may comprise a lump capacitance and may be implemented as, for example, a capacitor IPD or a surface mount capacitor chip. The lower terminal of RF passive component 820-1 is connected to a grounded region in the RDL laminate structure 810. The first bond wire 830-1 implements the inductance included in circuit "Input_2f" shown in FIG. 9B, and RF passive component 820-1 implements the capacitance included in circuit "Input_2f."

A second bond wire 830-2 connects the upper drain terminal 253 of RF transistor amplifier die 210 to an upper terminal of RF passive component 820-2, which forms a shunt capacitor to ground. RF passive component 820-2 may be implemented as, for example, a capacitor IPD or as a surface mount capacitor chip. A lower terminal of RF passive component 820-2 is connected to a grounded region in the RDL laminate structure 810 via contacts 280.

The second bond wire 830-2 and a lump capacitance implemented in RF passive component 820-2 together implement the series L-C circuit labelled "Output_f0" in FIG. 9B. The RF output 842 is implemented as a conductive structure in the RDL laminate structure 810, and may be connected to a second external circuit. The RF output 842 is connected by a contact 280 to the lower drain terminal 224 of RF transistor amplifier die 210, and is connected to the drain of RF transistor amplifier die 210 through the conductive drain vias 264. The inherent inductance of the conductive drain vias 264 in RF transistor amplifier die 210 is shown in FIG. 9B as the inductance "Lvia_D."

Figure 10A:
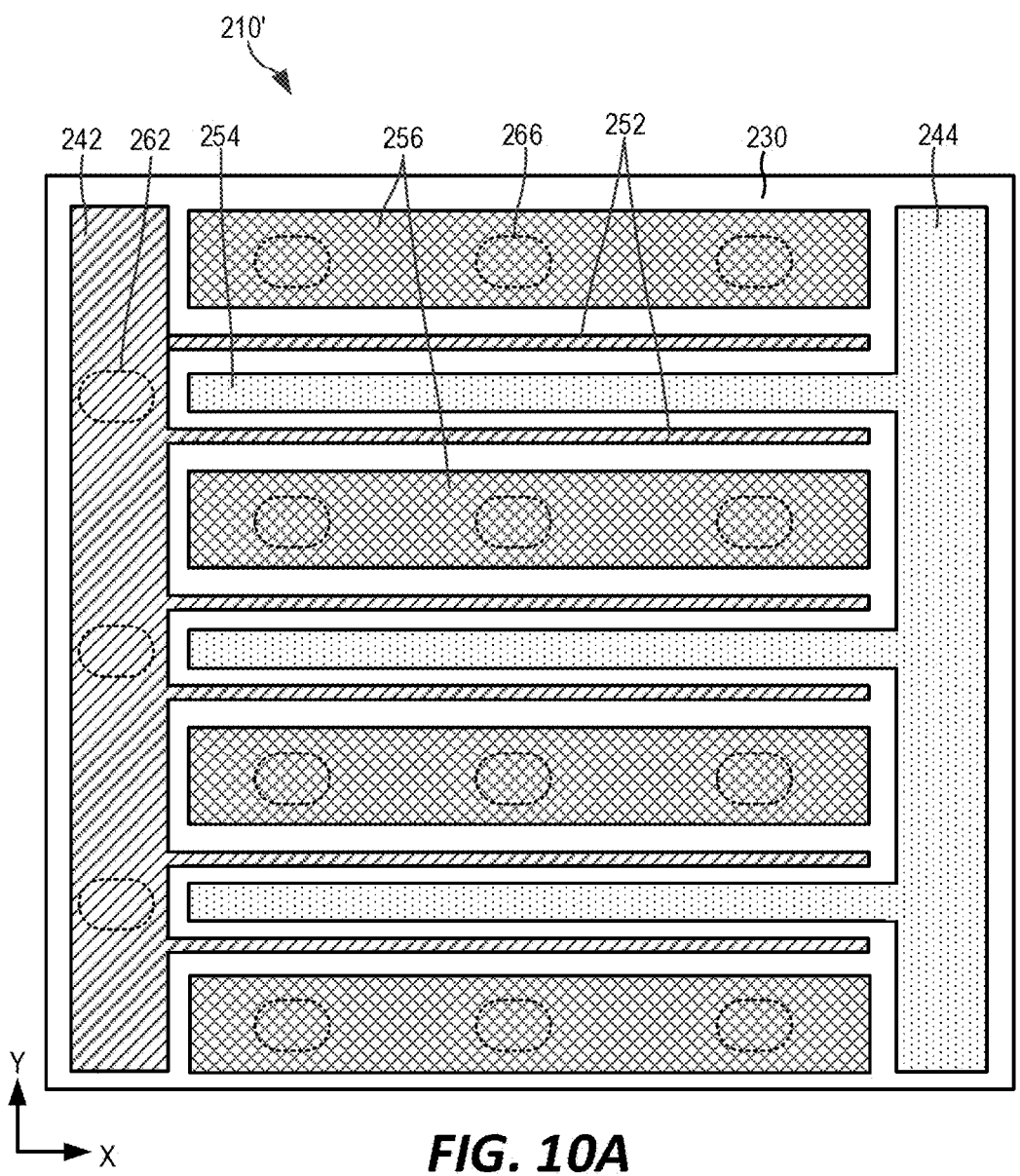
FIGS. 10A and 10B are schematic cross-sectional views that show the top metallization structures of two RF transistor amplifier dies according to further embodiments of the present invention.
Figure 10B:
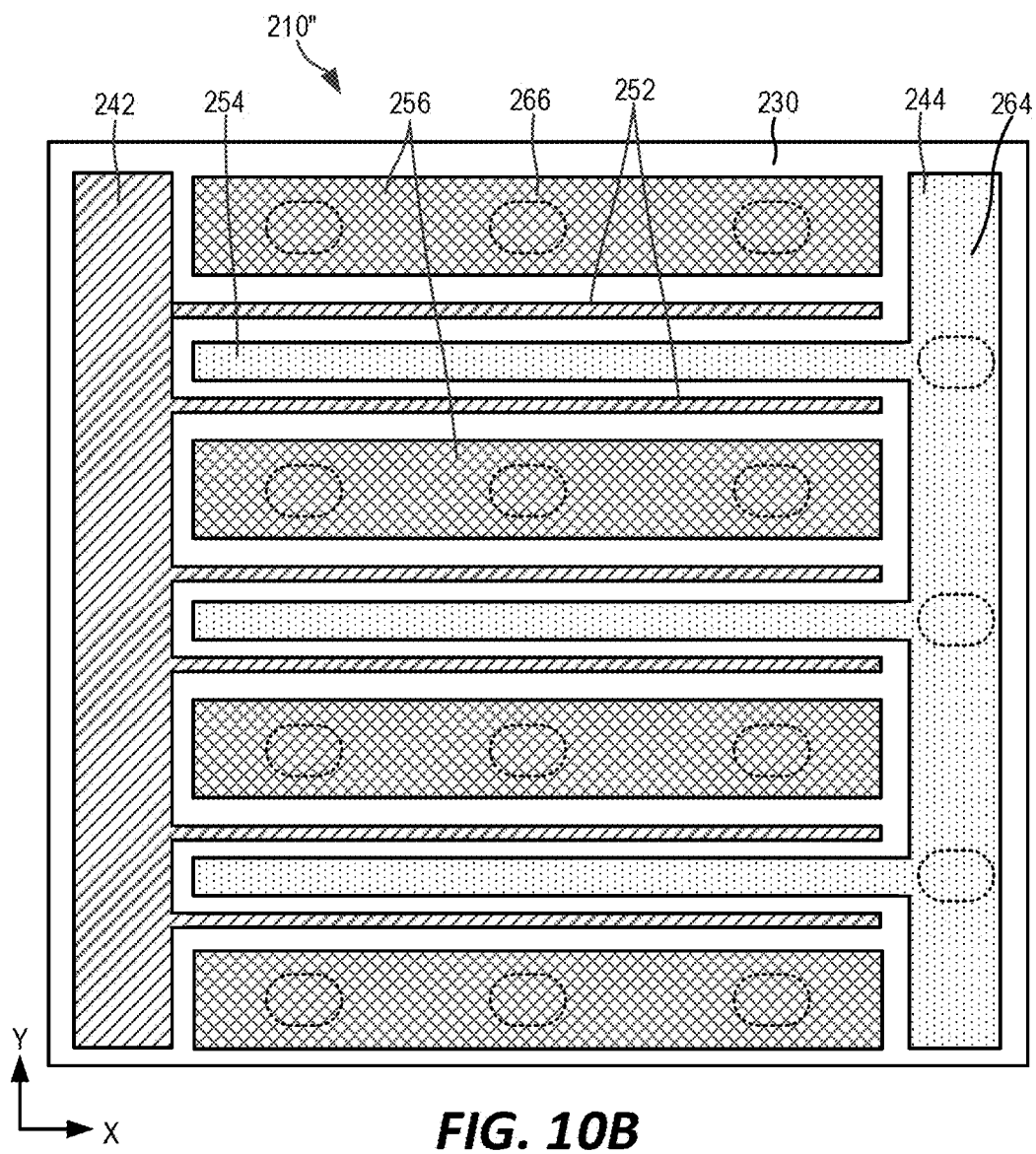

FIGS. 10A and 10B are schematic cross-sectional views that illustrate the structure of the top metallization of two RF transistor amplifier dies according to further embodiments of the present invention.

As shown in FIG. 10A, an RF transistor amplifier die 210' according to embodiments of the present invention is very similar to RF transistor amplifier die 210, except that RF transistor amplifier die 310 does not include drain vias 264, and the drain terminal in RF transistor amplifier die 210' may be implemented on the top side of the semiconductor layer structure 230 and connected to, for example, a drain lead via bond wire(s), in the manner discussed above with reference to the RF transistor amplifier 100 of FIGS. 1A-1B. The RF transistor amplifier die 210' may be used, for example, when bond wires do not provide too much inductance for any of the output matching networks. The remainder of RF transistor amplifier die 210' may be identical to RF transistor amplifier 210, and hence further description thereof will be omitted.

As shown in FIG. 10B, an RF transistor amplifier die 210" according to embodiments of the present invention is also very similar to RF transistor amplifier die 210, except that RF transistor amplifier die 210" does not include gate vias 262, and the gate terminal in RF transistor amplifier die 210" may be implemented on the top side of the semiconductor layer structure 230 and connected to, for example, a gate lead via bond wire(s), in the manner discussed above with reference to the RF transistor amplifier 100 of FIGS. 1A-1B. The RF transistor amplifier die 210" may be used, for example, when bond wires do not provide too much inductance for any of the input matching networks. The remainder of RF transistor amplifier die 210" may be identical to RF transistor amplifier 210, and hence further description thereof will be omitted. RF transistor amplifier dies 210', 210" may be used in place of RF transistor amplifier die 210 in any of the above-described embodiments of the present invention.

As described above with reference to FIGS. 8A-9B, the RF transistor amplifiers according to embodiments of the present invention may include RF passive components in the form of IPDs that are mounted on an RDL laminate structure or other substrate. In the embodiments of FIGS. 8A-9B, the ground connections to the RF passive components 720, 820 are formed using contacts 280, while the other connections to the IPDs are formed using bond wires. Pursuant to further embodiments of the present invention, all of the electrical connections to the RF passive components may be formed using conductive bumps or other electrical connections other than wire bonding connections. This may further simplify the manufacturing operations, allow for smaller device footprints (since large wire bond pads are no longer required), and remove some of the RF performance issues that may arise when wire bond connections are used such as variation in the inductance (due to variation in the lengths of the bond wires), parasitic inductances, and the problem of too much inductance, particularly in high frequency applications.

Figure 11A:
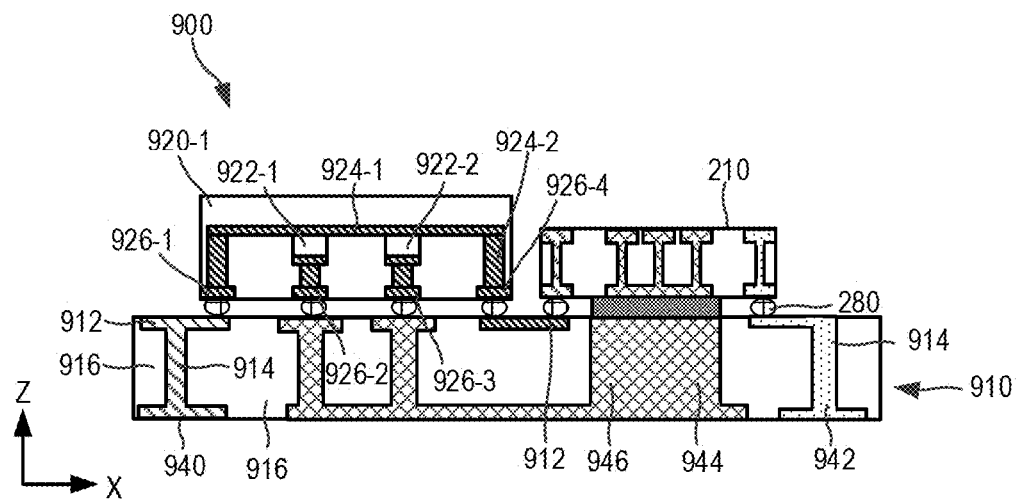
FIG. 11A is a schematic cross-sectional view of an RF transistor amplifier according to still further embodiments of the present invention.

FIG. 11A is a schematic cross-sectional view of one such RF transistor amplifier 900 according to embodiments of the present invention. As shown in FIG. 11A, the RF transistor amplifier 900 includes an RF transistor amplifier die 210 (or any of the other RF transistor amplifier dies according to embodiments of the present invention) and an RF passive component 920-1, which are both mounted on an RDL laminate structure 910. In the embodiment of FIG. 11A, the RF transistor amplifier 900 includes an input impedance matching circuit and an input harmonic termination circuit, but does not include any output matching circuits. The input matching circuits are primarily implemented in RF passive component 920-1.

The RDL laminate structure 910 includes a plurality of conductive traces 912 and conductive vias 914 that are formed within a dielectric base 916. The conductive traces 912 and conductive vias 914 are used to electrically connect various terminals on the RF transistor amplifier die 210 and the RF passive component 920-1. The RDL laminate structure 910 further includes electrical connections to external circuits including connections to a gate lead 940, a drain lead 942 and a source connection 944. The source connection 944 may be connected to electrical ground in some embodiments. The RDL laminate structure 910 further includes a metal slug 946 (or, alternatively, a dense array of metal-filled or mostly filled, e.g., at least 75% filled or at least 85% filled vias such as copper-filled vias) that dissipates heat generated in the RF transistor amplifier die 210 to outside a package (not shown) of the RF transistor amplifier 900.

The electrical connections to the RF transistor amplifier die 210 are made to the back side of the die 210 at the lower ends of the conductive gate, drain and source vias 262, 264, 266. The RF transistor amplifier die 210 may be directly attached to the RDL laminate structure 910 using typical die attach techniques such as eutectic materials, precoats (e.g., a gold-tin precoat), solder pre-forms, sintering (e.g., Ag-sintering) and the like.

The RF passive component 920-1, which may be, for example, an IPD, is flip-chip attached to the RDL laminate structure 910. The RF passive component 920-1 may have a plurality of terminals on an "upper" side thereof, and a plurality of contacts such as conductive bumps 280 may be pre-attached to there terminals. The RF passive component 920-1 may then be turned upside-down and the conductive bumps 280 may be mounted on corresponding conductive pads on the RDL laminate structure 910 to physically and electrically attach the RF passive component 920-1 to the RDL laminate structure.

The RF passive component 920-1 may include one or more capacitors and/or one or more inductors that may be used to implement at least a potion of the input matching networks. In the embodiment shown in FIG. 11A, the RF passive comment 920-1 includes a pair of capacitors 922-1, 922-2 and a pair of inductors 924-1, 924-2, which are illustrated schematically in FIG. 11A. The inductors 924 may be implemented, for example, as conductive traces which may be narrowed, elongated, spiraled or the like so that they will generate a desired amount of inductance. The amount of inductance generated by each such conductive trace may be carefully controlled, unlike the inductance generated by the aforementioned wire bonding processes which may have variation in wire lengths as great as 4 mils.

As shown in FIG. 11A, the gate lead 940 on RDL laminate structure 910 is connected by a conductive via to a conductive pad 912 on the upper side of RDL laminate structure 910. A first contact 280 electrically connects the conductive pad 912 to a first terminal 926-1 of RF passive component 920-1. The first terminal 926-1 is electrically connected to a first electrode of the first capacitor 922-1. The second electrode of the first capacitor 922-1 may be connected a second terminal 926-2 of RF passive component 920-1, which in turn is connected to a corresponding pad on the RDL laminate structure 910 by a second contact 280. The second contact 280 may be electrically connected to a source connection on the RDL laminate structure 910, which may be connected to electrical ground. The first electrode of the first capacitor 922-1 is connected to a first electrode of the second capacitor 922-2 by a first inductive trace segment 924-1. The second electrode of the second capacitor 922-2 may be connected a third terminal 926-3 of RF passive component 920-1, which in turn is connected to a corresponding pad on the RDL laminate structure 910 by a third contact 280. The third contact 280 may be electrically connected to the source connection on the RDL laminate structure 910. The first electrode of the second capacitor 922-2 is connected by a second inductive trace segment 924-2 to a fourth terminal 926-4 of RF passive component 920-1, which in turn is connected to a corresponding pad on the RDL laminate structure 910 by a fourth contact 280. The gate terminal 222 on the RF transistor amplifier die 210 is connected via a fifth contact 280 to the same pad 912 on RDL laminate structure 910, so that RF signals input at the gate lead 940 on RDL laminate structure 910 may be passed through RF passive component 920-1 to the gate of RF transistor amplifier die 210. The drain terminal 224 of RF transistor amplifier die 210 is connected to the drain lead 942 on RDL laminate structure 910 by contact 280 and a conductive via in RDL laminate structure 910.

Figure 11B:
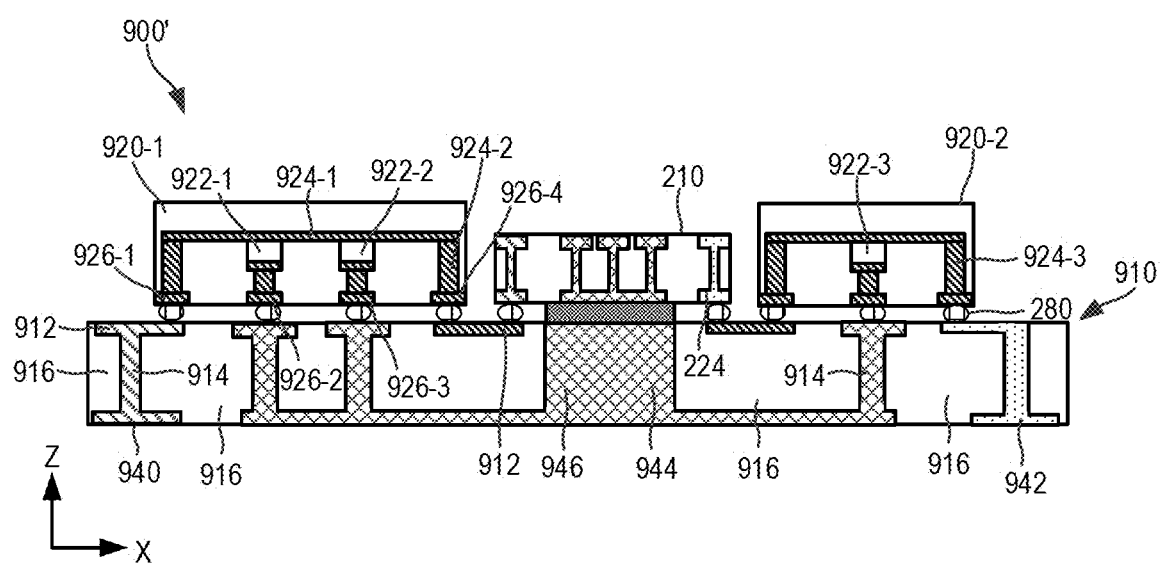
FIG. 11B is a schematic cross-sectional view of a modified version of the RF transistor amplifier of FIG. 11A.

FIG. 11B is a schematic cross-sectional view of an RF transistor amplifier 900' according to further embodiments of the present invention. RF transistor amplifier 900' is similar to RF transistor amplifier 900 of FIG. 11A, but further includes an output matching network. The description of RF transistor amplifier 900' will focus on the output matching network as the remainder of RF transistor amplifier 900' is identical to RF transistor amplifier 900.

As shown in FIG. 11B, RF transistor amplifier 900' includes a second RF passive component 920-2 that is electrically interposed between the drain terminal 224 of RF transistor amplifier die 210 and drain lead 942 on RDL laminate structure 910. RF passive component 920-2 may also be, for example, an IPD that is flip-chip attached to the RDL laminate structure 910. RF passive component 920-2 may have a plurality of terminals on an "upper" side thereof, and a plurality of contacts 280 may be pre-attached to the terminals. In the depicted embodiment, RF passive component 920-2 includes a shunt L-C network including capacitor 922-3 and inductor 924-3 for impedance matching and a series transmission line connects the drain terminal 224 of RF transistor amplifier die 210 to the drain lead 942 of RDL laminate structure 910. The impedance of the series transmission line can be adjusted by, for example, adjusting the width (or thickness) of the conductive trace to further enhance the impedance match at the output of RF transistor amplifier 900'.

Figure 11C:
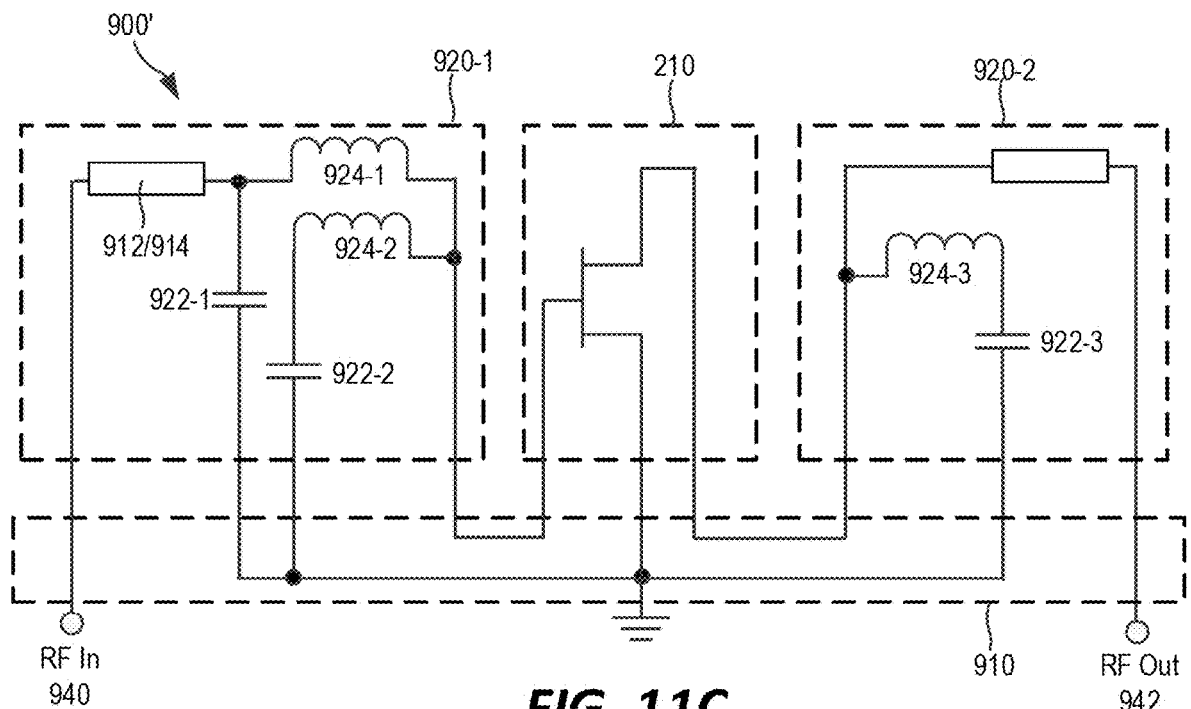
FIG. 11C is a circuit diagram of the RF transistor amplifier of FIG. 11B.

FIG. 11C is a schematic circuit diagram of RF transistor amplifier 900' of FIG. 11B. In FIG. 11B, the circuit elements included in RF transistor amplifier die 210, RF passive components 920-1, 920-2 and RDL laminate structure 910 are shown.

Figure 11D:
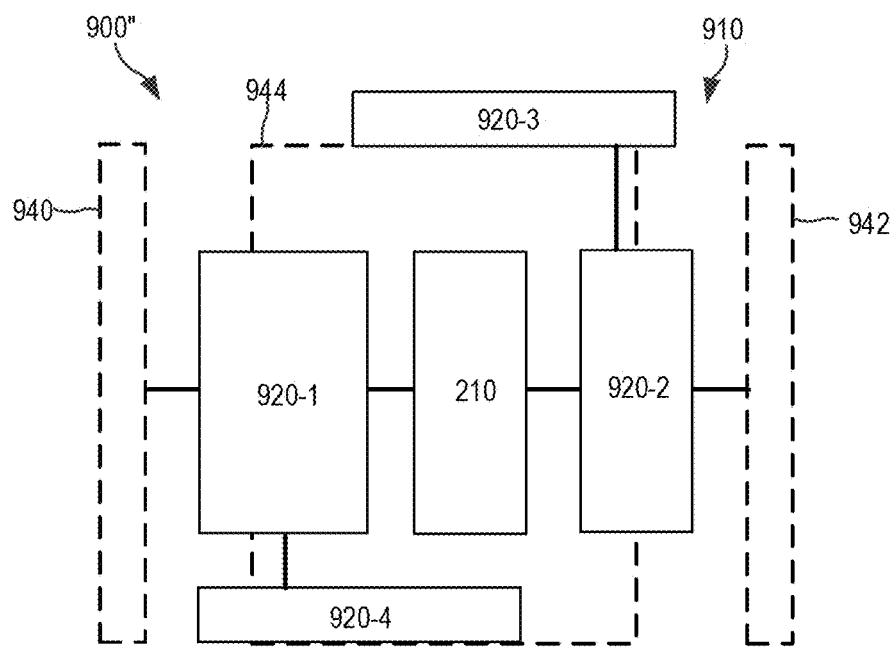
FIG. 11D is a schematic plan view of the RF transistor amplifier of FIG. 11B.

FIG. 11D is a schematic top view of an RF transistor amplifier 900" that is similar to RF transistor amplifier 900' of FIGS. 11B-11C. As shown in FIG. 11D, the RF transistor amplifier 900" includes the RDL laminate structure 910, the RF transistor amplifier die 210 and the RF passive components 920-1, 920-2 of RF transistor amplifier 900'. As these components and the electrical connections therebetween have already been described above, further description thereof will be omitted. RF transistor amplifier 900" further includes two additional RF passive components 920-3, 920-4 in the form of high density (i.e., high capacitance) capacitor chips. RF passive component 920-3 is inductively connected to the capacitors 922 in RF passive component 920-1, and RF passive component 920-4 is inductively connected to the capacitors 922 in RF passive component 920-2. The capacitances in RF passive components 920-3, 920-4 may improve the video bandwidth performance of RF transistor amplifier 900" as compared to RF transistor amplifier 900'. A minimum amount of inductance may be required to in the connection between RF passive components 920-1 and 920-3 and in the connection between RF passive components 920-2 and 920-4 in order to isolate the RF signal path from the resistive losses in the high density capacitor chips 920-3, 920-4. In some embodiments, the necessary inductances may be implemented in RF passive devices 920-1, 920-2.

FIG. 11D also illustrates the gate lead 940, drain lead 942 and source lead 944 that are implemented in RDL laminate structure 910. The gate and drain leads 940, 942 may be implemented on opposed sides of RDL laminate structure 910, with the source lead 944 therebetween. The source lead 944 may be implemented as a dense array of conductive vias and/or as a large conductive pad that may sit on a corresponding conductive pad/slug on an interconnection structure such as a printed circuit board of an end device that includes RF transistor amplifier 900" in order to electrically connect the source lead 944 to electrical ground and to provide a thermal dissipation path through the interconnection structure. The gate and drain leads 940, 942 may similarly be electrically connected to corresponding pads on the interconnection structure.

Figure 12A:
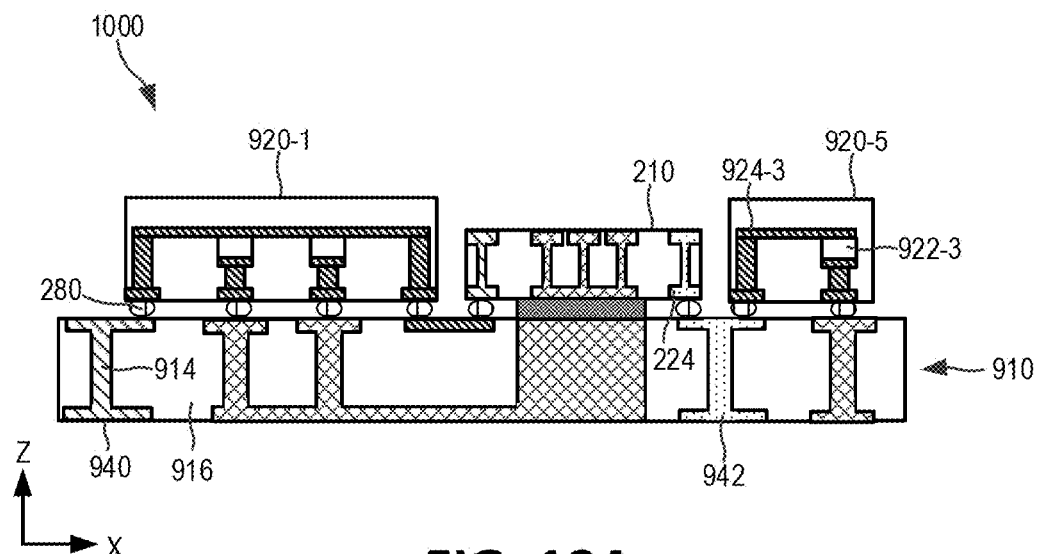
FIG. 12A is a schematic cross-sectional view of an RF transistor amplifier according to yet additional embodiments of the present invention.
Figure 12B:
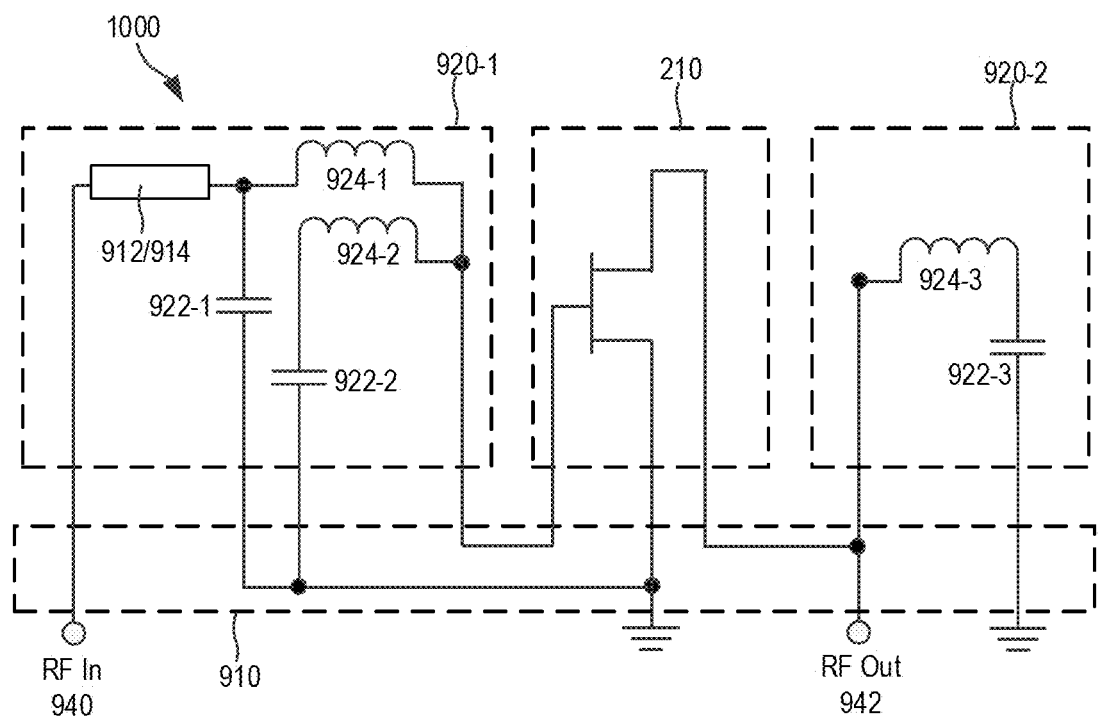
FIG. 12B is a circuit diagram of the RF transistor amplifier of FIG. 12A.

FIGS. 12A-12B illustrate an RF transistor amplifier 1000 according to further embodiments of the present invention. RF transistor amplifier 1000 is similar to RF transistor amplifier 900", but has a different output matching circuit. In particular, as shown in FIG. 12A, the drain lead 942 connects directly to the drain terminal 224 on RF transistor amplifier die 210, and the shunt L-C circuit 922-3, 924-3 is likewise coupled to the drain terminal 224. FIG. 12B is an equivalent circuit diagram of the RF transistor amplifier of FIG. 12A.

Figure 13:
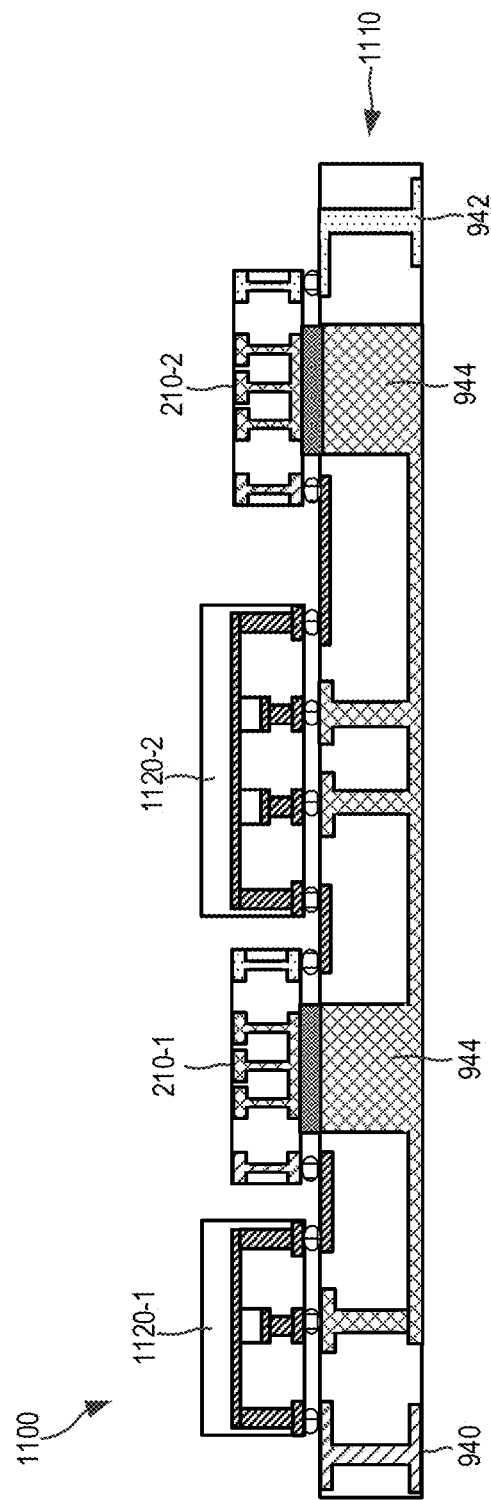
FIG. 13 is a schematic cross-sectional view of an RF transistor amplifier according to still further embodiments of the present invention.

FIG. 13 is a schematic cross-sectional view of an RF transistor amplifier 1300 according to still further embodiments of the present invention. The RF transistor amplifier 1300 of FIG. 13 is similar to the RF transistor amplifier 900 of FIG. 11A, with the primary difference being that RF transistor amplifier 1300 is a multi-stage amplifier that includes two RF transistor amplifier dies 210-1, 210-2 mounted on an RDL laminate structure 1110, and RF transistor amplifier 1300 also includes an inter-stage impedance matching circuit that is implemented in RF passive component 1120-2. The input impedance matching RF passive component 1120-1 also has a slightly different design than the corresponding RF passive component 920-1 in FIG. 11A.

It will be appreciated that while in some embodiments, each of the two RF transistor amplifier dies 210-1, 210-2 may be identical, this need not be the case. For example, in other embodiments, one of the RF transistor amplifier dies 210-1, 210-2 may be smaller than the other or may have a different configuration. It will also be appreciated that one of the two RF transistor amplifier dies 210-1, 210-2 may comprise a Group III nitride based RF transistor amplifier while the other may be implemented in a different technology such as, for example, a silicon LDMOS RF transistor amplifier. Moreover, while the RF transistor amplifier dies 210-1, 210-2 shown in FIG. 13 each have both conductive gate vias and conductive drain vias, it will be appreciated that one or both may only have conductive gate vias or only have conductive drain vias, or have neither conductive gate vias or conductive drain vias in further embodiments.

Figure 14:
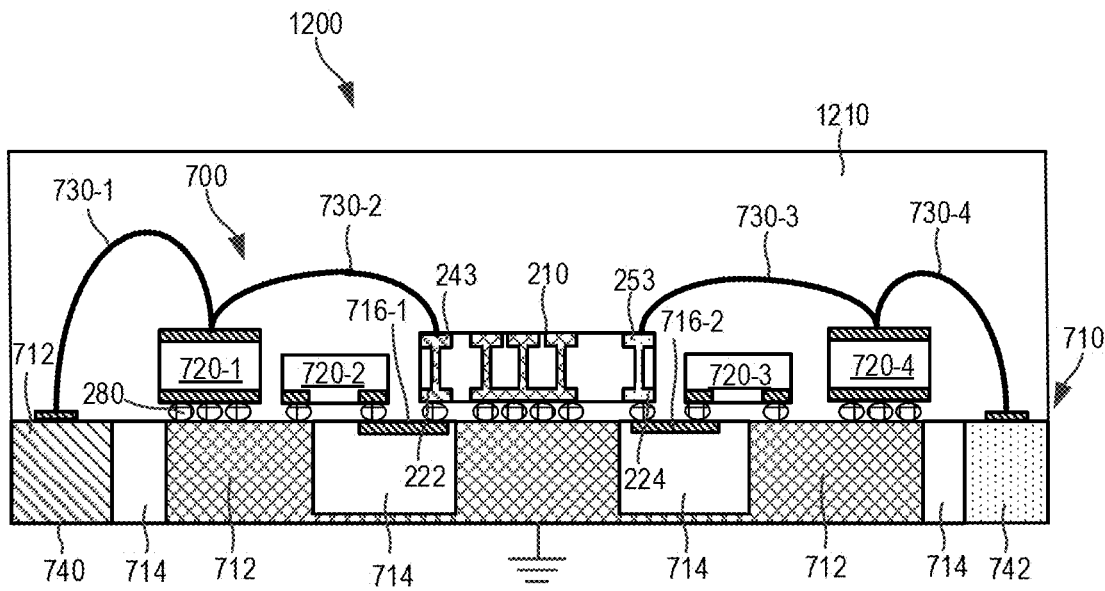
FIG. 14 is a schematic cross-sectional view of a packaged RF transistor amplifier according to embodiments of the present invention that includes an overmold package.

The RF transistor amplifiers according to embodiments of the present invention that include RF transistor amplifier dies that are mounted on a RDL laminate structures may be particularly well-suited to overmold packaging. FIG. 14 is a schematic cross-sectional view of a packaged RF transistor amplifier 1200 according to embodiments of the present invention that includes such overmold packaging. As shown in FIG. 14, a plastic overmold 1210 may be formed on the top surface of the RF amplifier die 700 of FIG. 8A. The plastic overmold 1210 may be formed as part of a wafer level packaging process where a plurality of RF amplifier die 700 are mounted on a large RDL laminate structure (not shown). After the plastic overmold is formed on the large RDL laminate structure and on the individual RF transistor amplifier die 700, the large RDL laminate structure with the RF transistor amplifier die 700 mounted thereon may be diced to provide a plurality of the packaged RF transistor amplifiers 1200 shown in FIG. 14. In other embodiments, the plastic overmold 1210 may be applied directly to the RF transistor amplifier structure shown in FIG. 8A. In that case, the plastic overmold may also be formed to cover the sidewalls of the RDL laminate structure 710. This technique may be applied, for example, when fan-out configurations are used since the RF transistor amplifier die may be applied to the interconnection structure after the wafer is diced and the plastic overmold may be applied after the RF transistor amplifier die is mounted on the interconnection structure. It will be appreciated that any of the RF transistor amplifiers according to embodiments of the present invention that include RF transistor amplifier dies that are mounted on a RDL laminate structure that are disclosed herein may be packaged in either of the above-described plastic overmold packaging configurations. Note that herein the term "overmold" is used broadly to encompass protective plastic coatings and the like that are deposited on top of a wafer before the wafer is diced into individual die, as is shown, for example, in FIG. 14.

It will be appreciated that any of the RF transistor amplifiers according to embodiments of the present invention that are discussed above may be mounted in packages such as the open cavity and overmold packages shown in FIGS. 4C and 4D, respectively to provide packaged RF transistor amplifiers that can be readily shipped to customers. Thus, the RF transistor die 210 and interconnection structures 270 shown in FIGS. 4C-4D may be replaced with the RF transistor die and interconnection structures according to any of the embodiments of the present invention that are discussed herein to provide many further embodiments of packaged RF transistor amplifiers.

Figure 15A:
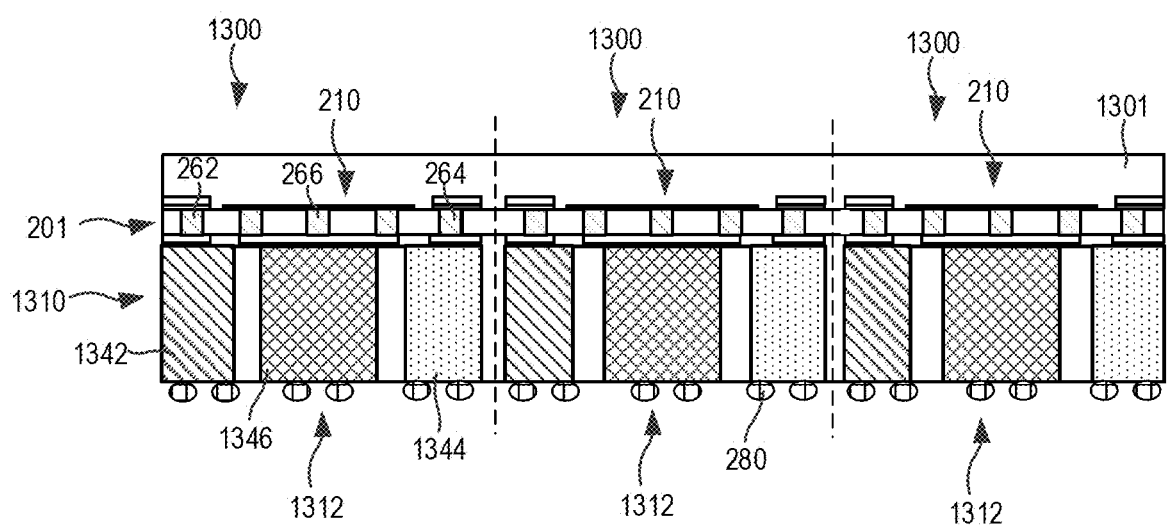
FIGS. 15A-17B are schematic cross-sectional views of RF transistor amplifiers according to further embodiments of the present invention that include protective plastic packaging.
Figure 15B:
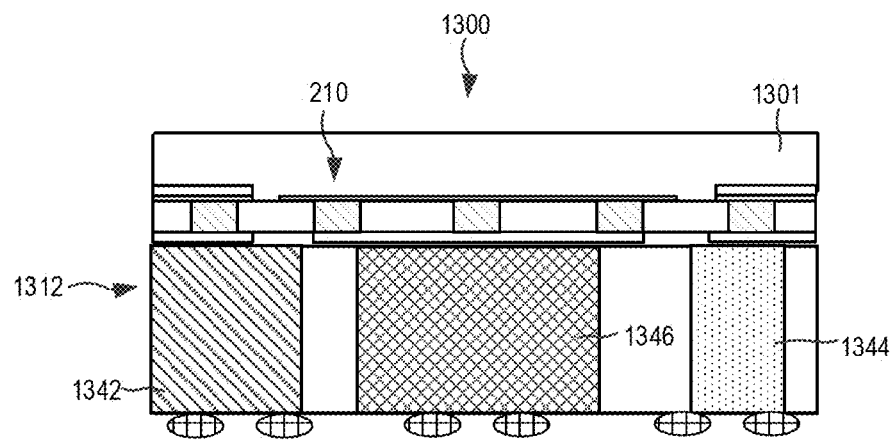
Figure 15C:
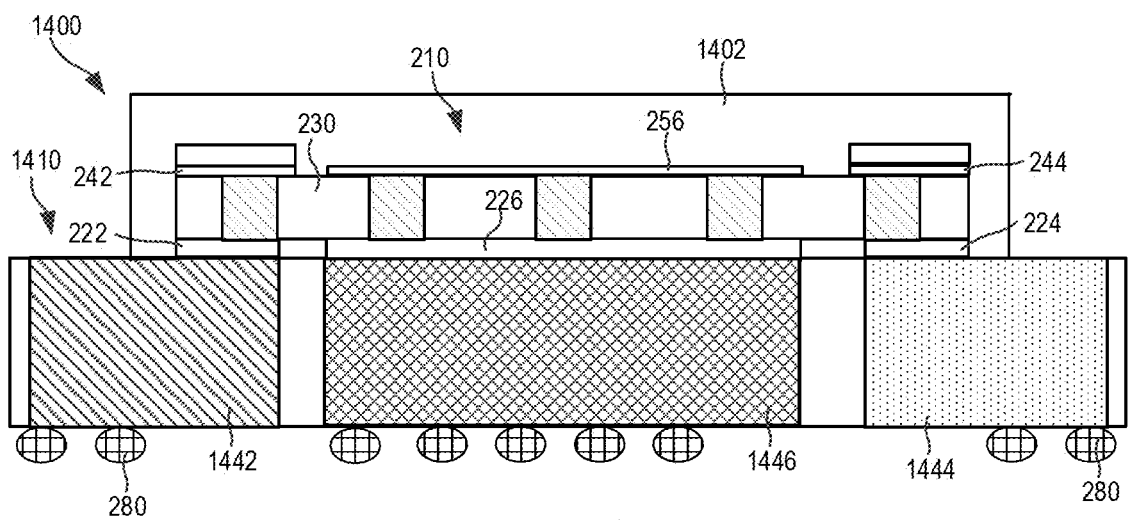

It will also be appreciated that protective plastic packaging may be applied to any of the RF transistor amplifiers according to embodiments of the present invention that are disclosed herein. FIGS. 15A through 15C illustrate additional examples of RF transistor amplifiers according to embodiments of the present invention that include protective plastic packaging. As shown in FIG. 15A, the wafer 201 of FIG. 4A (only a portion of which is visible in FIG. 15A) has a plurality of RF transistor die 210 formed thereon. The wafer 201 is mounted on a composite RDL laminate substrate 1310. The composite RDL laminate substrate 1310 includes a plurality of individual RDL laminate substrates 1312 that are positioned underneath the respective RF transistor amplifier die 210. Each individual RDL laminate substrate 1312 includes a metal gate slug 1342, a metal drain slug 1344 and a metal source slug 1346 that are provided within a dielectric of the composite RDL laminate substrate 1310. The wafer 201 may be mounted on the composite RDL laminate substrate 1310 by any appropriate means, such as using contacts (e.g., conductive solders or die attach material).

The metal gate slug 1342 in each individual RDL laminate substrate 1312 is electrically connected to the conductive gate via 262 of its associated RF transistor amplifier die 210, the metal drain slug 1344 in each individual RDL laminate substrate 1312 is electrically connected to the conductive drain via 264 of its associated RF transistor amplifier die 210, and the metal source slug 1346 in each individual RDL laminate substrate 1312 is electrically connected to the conductive source vias 266 of its associated RF transistor amplifier die 210. A protective plastic coating 1301 may be applied to the top surface of the wafer 201 (either before or after the wafer 201 is mounted on the composite RDL substrate 1310). The wafer 201 with the protective plastic coating 1301 thereon may then be diced along the vertical dashed scribe lines shown in FIG. 15A to form individual RF transistor amplifiers 1300 that each comprise an RF transistor die 210 mounted on an individual RDL laminate substrate 1312. One such individual RF transistor amplifier 1300 is schematically depicted in FIG. 15B. The example of FIGS. 15A-15B illustrates one example way in which wafer level processing may be used to form the individual RF transistor amplifiers 1300.

The wafer level processing technique described above with reference to FIGS. 15A-15B may be particularly suitable for use with individual RDL laminate substrates 1312 that have a fan-in design, since each individual RDL laminate substrate 1312 will have about the same "footprint" (i.e., area when viewed from above) as its associated RF transistor amplifier die 210.

When the individual RDL laminate substrates 1312 have a fan-out topology, and hence have a footprint that is larger than the individual RDL laminate substrates 1312, it may not always be practical to attach the above discussed composite RDL laminate structure 1310 to the wafer 201 and then dice both together, as this would require spacing the individual RF transistor die 210 farther apart on the wafer 201 so that an RF transistor amplifier die 210 would be positioned above each individual RDL laminate structure 1312. Thus, for such fan-out RDL laminate substrates 1312, the plastic coating 1301 may be applied as a wafer level processing step and the wafer 201 may then be diced into individual RF amplifier dies 210 (each with a plastic coating on a top surface thereof). Thereafter, the individual RF transistor amplifier dies 210 may be mounted on the composite RDL laminate substrate 1310, which may then be diced. Alternatively, each RF transistor amplifier die 210 may be mounted on a respective individual RDL laminate substrate 1312.

Referring next to FIG. 15C, in still other embodiments, the protective plastic packaging may be applied after the wafer 201 of FIG. 4A is diced into individual RF transistor amplifier die 210. When the protective plastic packaging is applied after dicing it may be applied as a plastic overmold 1402 that covers the top surface and sidewalls of each RF amplifier die 210. In the embodiment of FIG. 15C, the RF amplifier die 210 with the plastic overmold 1402 thereon is mounted on an individual RDL laminate substrate 1410 using any appropriate contacts such as, for example, die attach material to provide an RF transistor amplifier 1400.

Figure 16A:
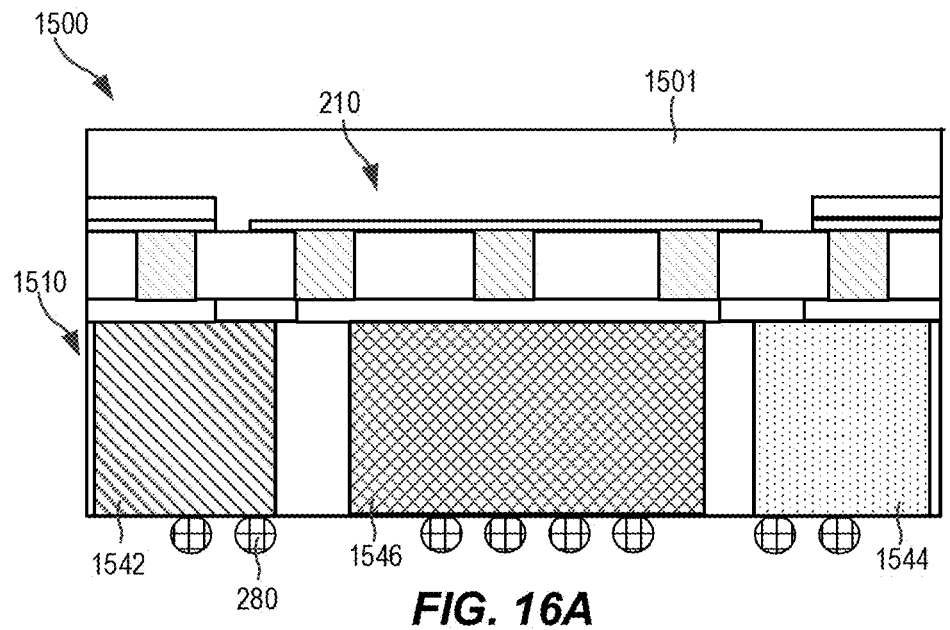
Figure 16B:
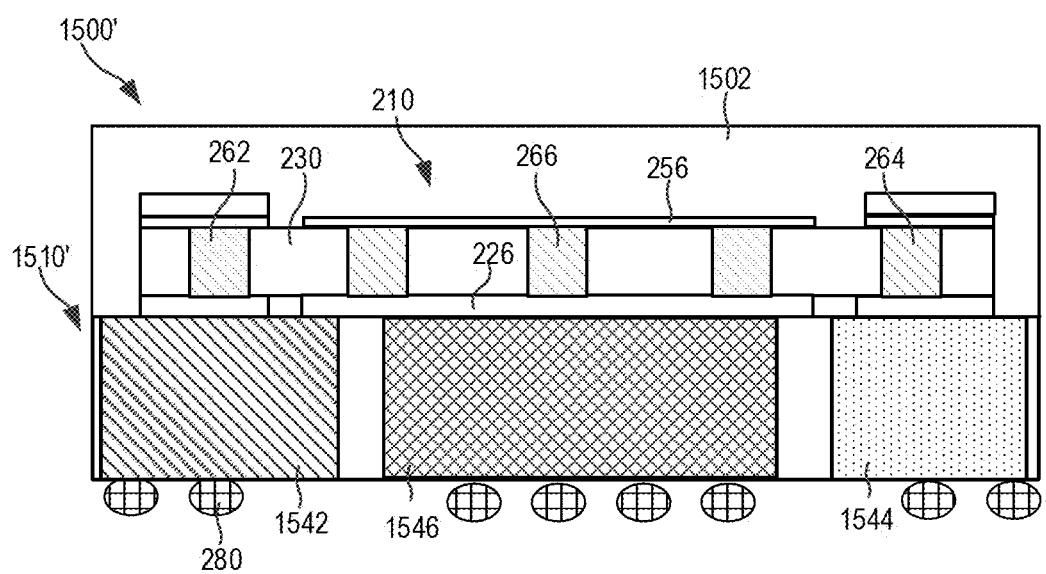

As yet another example, protective plastic coatings may be applied to RF transistor amplifier die according to embodiments of the present invention that are mounted on custom interposers. FIG. 16A illustrates one such example embodiment in which the RF transistor die 210 is coated with a protective plastic coating 1501 as part of a wafer level processing step. The coated RF transistor amplifier die 210 is then mounted on a custom interposer 1510 to provide RF transistor amplifier 1500, as shown in FIG. 16A. The interposer 1510 included in RF transistor amplifier 1500 includes conductive gate, drain and source connections 1542, 1544, 1546 which are implemented as large metal slugs. In other embodiments, a protective plastic overmold 1502 may be applied after the wafer 201 of FIG. 4A is diced into individual RF transistor amplifier die 210. When the protective plastic overmold 1502 is applied after dicing it may cover both the upper surface and sidewalls of the RF transistor amplifier die 210 to provide an RF transistor amplifier 1500', as shown in FIG. 16B. It will be appreciated that in the embodiments of FIGS. 16A and 16B the interposers 1510, 1510' may have either fan-in or fan-out topologies. To illustrate this, the interposer 1510 is shown having a fan-in topology while the interposer 1510' is shown having a fan-out topology.

Figure 17A:
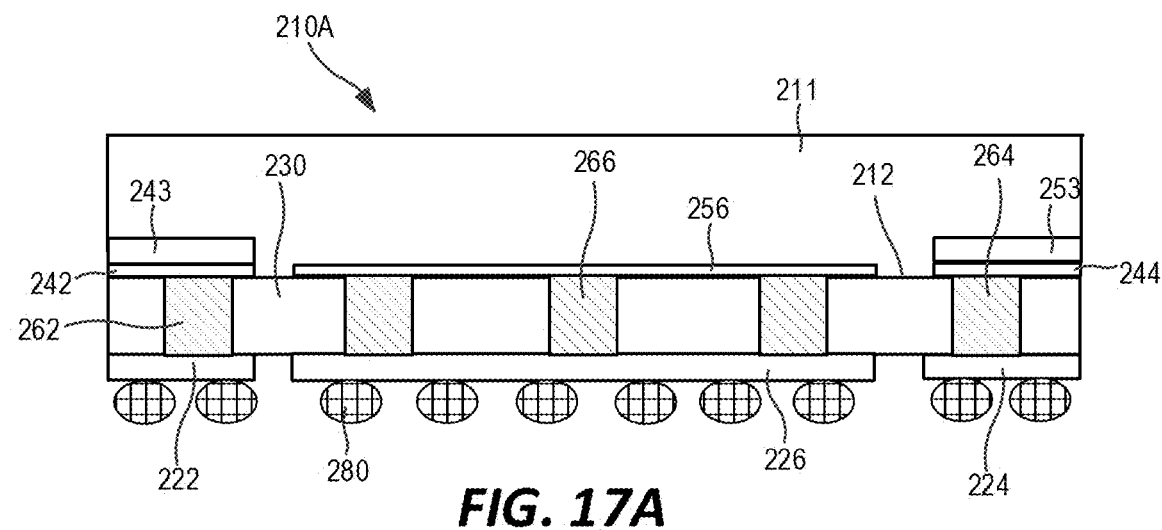

Alternatively, the RF transistor amplifier die may be provided as stand-alone parts that may be mounted by a customer on an interconnection structure such as a customer printed circuit board. The stand-alone RF transistor amplifier die may include a protective plastic package. In some embodiments, the protective plastic package may be applied as part of waver level packaging. Using the RF transistor die 210 of FIGS. 4A and 4B as an example, a protective plastic coating 211 may be applied to the top surface of the wafer 201 of FIG. 4A as part of a wafer level packaging step. The wafer 201 with the protective plastic coating 211 thereon may be diced to singulate the individual RF transistor die 210. As shown in FIG. 17A, this will provide RF transistor amplifier die 210A that each have a protective plastic coating 211 on an upper surface thereof. A customer may then mount the RF transistor amplifier die 210A on, for example, a customer printed circuit board or other interconnection structure.

Figure 17B:
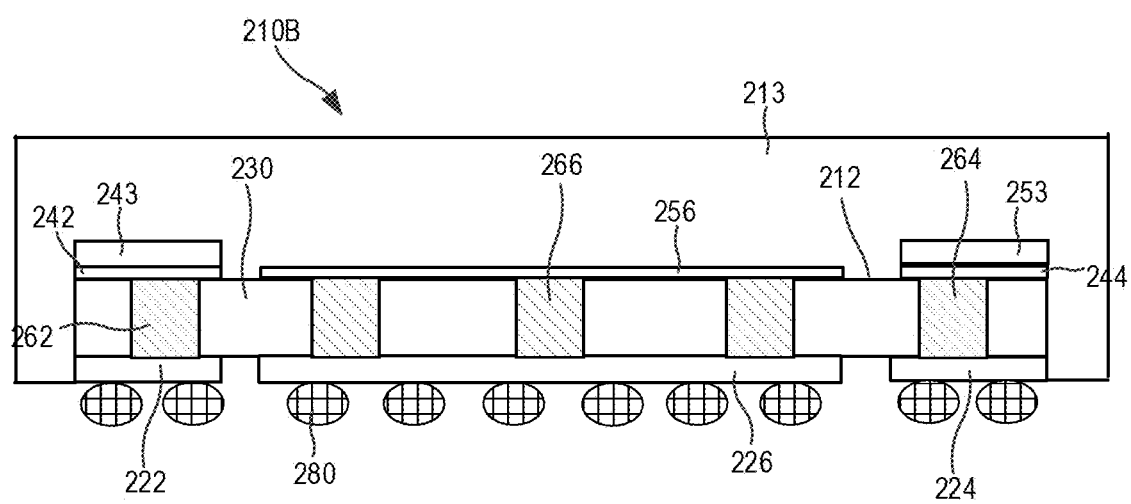

In other situations, it may be advantageous to apply the protective plastic packaging as a die level process. Once again, using the wafer 201 of FIG. 4A as an example, the wafer 201 may be singulated into individual RF transistor amplifier die 210 as discussed above and as shown in FIG. 4B. Thereafter, a protective plastic overmold 213 may be applied to the individual RF transistor amplifier die 210. When the protective plastic overmold 213 is applied after singulation, the protective plastic overmold 213 may cover both the upper and side surfaces of the RF transistor amplifier die 210 to provide an RF transistor amplifier die 210B. This is schematically shown in FIG. 17B. A customer may then mount the RF transistor amplifier die 210B on, for example, a customer printed circuit board or other interconnection structure.

Depending on the embodiment, the packaged RF transistor amplifier can include a monolithic microwave integrated circuit (MMIC) as the RF transistor amplifier die where the RF transistor amplifier die incorporates multiple discrete devices in a single integrated die. Additionally or alternatively, the package can comprise multiple RF transistor amplifier die in a path that are connected in series to form a multiple stage RF transistor amplifier and/or multiple RF transistor amplifier die that are disposed in multiple paths (e.g., in parallel) to form an RF transistor amplifier with multiple RF transistor amplifier die and multiple paths, such as in a Doherty amplifier configuration. In any of these multiple RF transistor amplifier die embodiments one or more, including all of the RF transistor amplifier die may be RF transistor amplifier die according to any of the embodiments described above.

While the example embodiments discussed above include a single RF amplifier die having a single stage amplifier, it will be appreciated that embodiments of the present invention are not limited thereto. In other embodiments, the amplifiers may include multiple stages, may have a Doherty configuration, etc.

The RF transistor amplifiers according to embodiments of the present invention may have a number of advantages as compared to conventional RF transistor amplifiers. The provision of conductive gate and drain vias in the RF transistor amplifier die may reduce or eliminate the need for bond wires. The elimination of bond wire connections may reduce costs and simplify manufacturing, and may improve the RF performance of the device since the amount of inductance in the impedance matching networks may be tightly controlled, and the problem of too much inductance in the matching networks can be avoided. Additionally, the elimination of bod wires may reduce the size of the device. Moreover, increased wafer level packaging becomes possible with the RF transistor amplifiers according to embodiments of the present invention, which may further simplify manufacturing and/or reduce production costs.

Embodiments of the present disclosure can be used, for example, in RF power products for 5G and base-station and/or handset applications, as well as in radar applications.

Embodiments of the present inventive concepts have been described above with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A radio frequency ("RF") transistor amplifier, comprising:
a Group III nitride-based RF transistor amplifier die that includes a semiconductor layer structure and a conductive via that extends through the semiconductor layer structure;
a first impedance matching circuit coupled between a first end of the conductive via and a first external electrical connection; and
a first harmonic termination circuit coupled between a second end of the conductive via and a second external electrical connection,
wherein the second end of the conductive via is opposite the first end.

2. The RF transistor amplifier of claim 1, wherein the conductive via is a conductive gate via that is connected to a gate electrode of the Group III nitride-based RF transistor amplifier die, and the first end of the conductive gate via is a top end that is adjacent the gate electrode and the second end of the conductive gate via is a bottom end.

3. The RF transistor amplifier of claim 1, wherein the conductive via is a conductive drain via that is connected to a drain electrode of the Group III nitride-based RF transistor amplifier die, and the first end of the conductive drain via is a bottom end and the second end of the conductive drain via is a top end that is adjacent the drain electrode.

4. The RF transistor amplifier of claim 2, further comprising a conductive drain via that is connected to a drain electrode of the Group III nitride-based RF transistor amplifier die.

5. The RF transistor amplifier of claim 4, further comprising:
a second impedance matching circuit coupled between a first end of the conductive drain via and a third external electrical connection.

6. The RF transistor amplifier of claim 1, further comprising a redistribution layer ("RDL") laminate substrate, wherein the Group III nitride-based RF transistor amplifier die is mounted on an upper surface of the RDL laminate substrate.

7. The RF transistor amplifier of claim 6, wherein the first end of the conductive via is a top end and the second end of the conductive via is a bottom end that is electrically connected to a first conductive pad on the RDL laminate substrate through a first contact.

8. The RF transistor amplifier of claim 4, wherein the conductive gate via, the conductive drain via and the conductive source via all have substantially a same shape and substantially a same cross-sectional area.

9. A radio frequency ("RF") transistor amplifier, comprising:
a Group III nitride-based RF transistor amplifier die that includes a semiconductor layer structure, a conductive source via that is connected to a source region of the Group III nitride-based RF transistor amplifier die, the conductive source via extending through the semiconductor layer structure, and an additional conductive via that extends through the semiconductor layer structure,
wherein a first end of the additional conductive via is connected to a first external circuit and a second end of the additional conductive via that is opposite the first end is connected to a first matching circuit.

10. The RF transistor amplifier of claim 9, wherein the additional conductive via is a conductive gate via that is connected to a gate electrode of the Group III nitride-based RF transistor amplifier die, and the first matching circuit is a first input matching circuit.

11. The RF transistor amplifier of claim 10, the Group III nitride-based RF transistor amplifier die further comprising a conductive drain via that is connected to a drain finger of the Group III nitride-based RF transistor amplifier die, wherein a first end of the conductive drain via is connected to a second external circuit and a second end of the conductive drain via that is opposite the first end of the conductive drain via is connected to a first output matching circuit.

12. The RF transistor amplifier of claim 9, wherein the additional conductive via is a conductive drain via that is connected to a drain finger of the Group III nitride-based RF transistor amplifier die, and the first matching circuit is a first output matching circuit.

13. The RF transistor amplifier of claim 10, further comprising an interconnection structure, wherein the Group III nitride-based RF transistor amplifier die is mounted on an upper surface of the interconnection structure.

14. The RF transistor amplifier of claim 13, wherein the first end of the conductive gate via is a top end and the second end of the conductive gate via is a bottom end that is electrically connected to a first conductive pad on the interconnection structure through a first contact.

15. The RF transistor amplifier of claim 14, wherein the first input matching circuit comprises a capacitor that is coupled between the bottom end of the conductive gate via and electrical ground.

16. The RF transistor amplifier of claim 14, wherein the first input matching circuit comprises a harmonic termination circuit, the RF transistor amplifier further comprising a second input impedance matching circuit that comprises a fundamental matching circuit that connects to the top end of the conductive gate via.

17. The RF transistor amplifier of claim 13, wherein the first end of the additional conductive via is a bottom end that is electrically connected to a first conductive pad on the interconnection structure through a first contact, and the second end of the additional conductive via is a top end.

18. The RF transistor amplifier of claim 13, wherein the first end of the conductive drain via is a top end and the second end of the conductive drain via is a bottom end that is electrically connected to a second conductive pad on the interconnection structure through a second contact.

19. The RF transistor amplifier of claim 13, wherein the first end of the conductive drain via is a bottom end that is electrically connected to a first conductive pad on the interconnection structure through a first contact and the second end of the conductive drain via is a top end.

20. The RF transistor amplifier of claim 9, wherein the first input matching circuit comprises a fundamental impedance matching circuit.

21. The RF transistor amplifier of claim 9, further comprising:
   an interconnection structure, wherein the Group III nitride-based RF transistor amplifier die is mounted on an upper surface of the interconnection structure; and
   a passive RF component that includes a capacitor mounted on the interconnection structure and electrically connected to the additional conductive via through the interconnection structure.

22. The RF transistor amplifier of claim 9, wherein the Group III nitride-based RF transistor amplifier die includes a plurality of parallel source fingers, wherein at least two conductive source vias are positioned underneath each of the conductive source fingers.

23. The RF transistor amplifier of claim 22, wherein the at least two conductive source vias that are positioned underneath a first of the conductive source fingers define a first axis, and the at least two conductive source vias that are positioned underneath a second of the conductive source fingers that is adjacent the first of the conductive source vias defines a second axis, and wherein the additional conductive via is positioned between the first axis and the second axis when the Group III nitride-based RF transistor amplifier die is viewed from above.

24. The RF transistor amplifier of claim 9, wherein the additional conductive via comprises a portion of the first matching circuit.

\* \* \* \* \*